(12) United States Patent
Gorobets et al.

(10) Patent No.: US 7,769,978 B2
(45) Date of Patent: *Aug. 3, 2010

(54) METHOD AND SYSTEM FOR ACCESSING NON-VOLATILE STORAGE DEVICES

(75) Inventors: Sergey A. Gorobets, Edinburgh (GB); Alan W. Sinclair, Falkirk (GB)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/313,633

(22) Filed: Dec. 21, 2005

(65) Prior Publication Data

US 2007/0143570 A1  Jun. 21, 2007

(51) Int. Cl.
*G06F 13/14* (2006.01)
(52) U.S. Cl. ..................................... 711/203; 711/103
(58) Field of Classification Search .................. None
See application file for complete search history.

(56) References Cited

U.S. PATENT DOCUMENTS

| | | | |
|---|---|---|---|
| 4,761,737 A | 8/1988 | Duvall et al. |
| 4,800,520 A | 1/1989 | Iijima |
| 4,802,117 A | 1/1989 | Chrosny et al. |
| 4,896,262 A | 1/1990 | Wayama et al. |
| 5,226,155 A | 7/1993 | Iijima |
| 5,369,754 A | 11/1994 | Fandrich et al. |
| 5,388,083 A | 2/1995 | Assar et al. |
| 5,404,485 A | 4/1995 | Ban |
| 5,530,673 A | 6/1996 | Tobita et al. |
| 5,542,066 A | 7/1996 | Mattson et al. |
| 5,544,356 A | 8/1996 | Robinson et al. |
| 5,570,315 A | 10/1996 | Tanaka et al. |
| 5,586,291 A | 12/1996 | Lasker et al. |
| 5,592,662 A | 1/1997 | Sawada et al. |
| 5,592,669 A | 1/1997 | Robinson et al. |
| 5,602,987 A | 2/1997 | Harari et al. |
| 5,619,690 A | 4/1997 | Matsumani et al. |
| 5,628,014 A | 5/1997 | Cecchini et al. |
| 5,634,050 A | 5/1997 | Krueger et al. |
| 5,636,355 A | 6/1997 | Ramakrishnan et al. |

(Continued)

FOREIGN PATENT DOCUMENTS

CN  1466060 A  1/2004

(Continued)

OTHER PUBLICATIONS

"Intel AP-686 Application Note, Flash File System Selection Guide", Dec. 1998, 18 pages.

(Continued)

*Primary Examiner*—Matt Kim
*Assistant Examiner*—Kaushikkumar Patel
(74) *Attorney, Agent, or Firm*—Jenkins, Wilson, Taylor & Hunt, P.A.

(57) ABSTRACT

Method for transferring data between a host system and a re-programmable non-volatile mass storage system having memory cells organized into blocks of memory cells is provided. The method includes receiving data via a first interface and/or a second interface; and making data accessible via the first interface and the second interface, even if a file name is not provided by a host system or before a write operation is complete.

26 Claims, 32 Drawing Sheets

U.S. PATENT DOCUMENTS

| | | |
|---|---|---|
| 5,708,846 A | 1/1998 | Ryan et al. |
| 5,754,888 A | 5/1998 | Yang et al. |
| 5,774,397 A | 6/1998 | Endoh et al. |
| 5,778,418 A | 7/1998 | Auclair et al. |
| 5,798,968 A | 8/1998 | Lee et al. |
| 5,799,168 A | 8/1998 | Ban |
| 5,809,558 A | 9/1998 | Matthews et al. |
| 5,832,493 A | 11/1998 | Marshall et al. |
| 5,848,420 A | 12/1998 | Xu |
| 5,867,641 A | 2/1999 | Jenett |
| 5,890,192 A | 3/1999 | Lee et al. |
| 5,896,393 A | 4/1999 | Yard et al. |
| 5,907,854 A | 5/1999 | Kerns |
| 5,928,347 A | 7/1999 | Jones |
| 5,933,846 A | 8/1999 | Endo |
| 5,937,425 A | 8/1999 | Ban |
| 5,953,538 A | 9/1999 | Duncan et al. |
| 5,966,720 A | 10/1999 | Itoh et al. |
| 5,973,964 A | 10/1999 | Tobita et al. |
| 5,978,893 A | 11/1999 | Bakshi et al. |
| 5,987,478 A | 11/1999 | See et al. |
| 5,996,047 A | 11/1999 | Peacock |
| 6,014,724 A | 1/2000 | Jenett |
| 6,016,530 A | 1/2000 | Auclair et al. |
| 6,021,415 A | 2/2000 | Cannon et al. |
| 6,038,636 A | 3/2000 | Brown, III et al. |
| 6,046,935 A | 4/2000 | Takeuchi et al. |
| 6,069,827 A | 5/2000 | Sinclair |
| 6,078,520 A | 6/2000 | Tobita et al. |
| 6,094,693 A | 7/2000 | Haneda |
| 6,145,069 A | 11/2000 | Dye |
| 6,148,354 A | 11/2000 | Ban et al. |
| 6,216,204 B1 | 4/2001 | Thiriet |
| 6,223,271 B1 | 4/2001 | Cepulis |
| 6,226,728 B1 | 5/2001 | See et al. |
| 6,256,690 B1 | 7/2001 | Carper |
| 6,275,436 B1 | 8/2001 | Tobita et al. |
| 6,275,804 B1 | 8/2001 | Carl |
| 6,279,069 B1 | 8/2001 | Robinson et al. |
| 6,286,056 B1 | 9/2001 | Edgar et al. |
| 6,286,256 B1 | 9/2001 | Weder |
| 6,370,614 B1 | 4/2002 | Teoman et al. |
| 6,373,746 B1 | 4/2002 | Takeuchi et al. |
| 6,380,597 B1 | 4/2002 | Gudesen et al. |
| 6,385,690 B1 | 5/2002 | Iida et al. |
| 6,389,433 B1 | 5/2002 | Bolosky et al. |
| 6,408,357 B1 | 6/2002 | Hanmann et al. |
| 6,412,040 B2 | 6/2002 | Hasbun et al. |
| 6,421,279 B1 | 7/2002 | Tobita et al. |
| 6,424,486 B2 | 7/2002 | Heaton et al. |
| 6,426,893 B1 | 7/2002 | Conley et al. |
| 6,427,186 B1 | 7/2002 | Lin et al. |
| 6,446,140 B1 | 9/2002 | Nozu |
| 6,456,528 B1 | 9/2002 | Chen |
| 6,466,973 B2 | 10/2002 | Jaffe |
| 6,467,015 B1 | 10/2002 | Nolan et al. |
| 6,467,021 B1 | 10/2002 | Sinclair |
| 6,467,022 B1 | 10/2002 | Buckland et al. |
| 6,477,616 B1 | 11/2002 | Takahashi |
| 6,480,935 B1 | 11/2002 | Carper et al. |
| 6,484,937 B1 | 11/2002 | Devaux et al. |
| 6,490,649 B2 | 12/2002 | Sinclair |
| 6,493,811 B1 | 12/2002 | Blades et al. |
| 6,504,846 B1 | 1/2003 | Yu et al. |
| 6,522,580 B2 | 2/2003 | Chen et al. |
| 6,535,949 B1 | 3/2003 | Parker |
| 6,542,407 B1 | 4/2003 | Chen et al. |
| 6,547,150 B1 | 4/2003 | Deo et al. |
| 6,567,307 B1 | 5/2003 | Estakhri |
| 6,598,114 B2 | 7/2003 | Funakoshi |
| 6,604,168 B2 | 8/2003 | Ogawa |
| 6,631,453 B1 * | 10/2003 | Friday .................. 711/163 |
| 6,631,456 B2 | 10/2003 | Leighnor et al. |
| 6,643,188 B2 | 11/2003 | Tanaka et al. |
| 6,646,948 B1 | 11/2003 | Stence et al. |
| 6,667,932 B2 | 12/2003 | Roohparvar et al. |
| 6,668,336 B2 | 12/2003 | Lasser |
| 6,681,239 B1 | 1/2004 | Munroe et al. |
| 6,728,851 B1 | 4/2004 | Estakhri et al. |
| 6,748,457 B2 | 6/2004 | Fallon et al. |
| 6,763,424 B2 | 7/2004 | Conley |
| 6,766,432 B2 | 7/2004 | Saltz |
| 6,771,536 B2 | 8/2004 | Li et al. |
| 6,772,955 B2 | 8/2004 | Yoshimoto et al. |
| 6,779,063 B2 | 8/2004 | Yamamoto |
| 6,781,877 B2 | 8/2004 | Cernea et al. |
| 6,798,710 B2 | 9/2004 | Roohparvar et al. |
| 6,810,462 B2 | 10/2004 | Matsunami et al. |
| 6,823,417 B2 | 11/2004 | Spencer |
| 6,834,331 B1 | 12/2004 | Liu |
| 6,839,823 B1 | 1/2005 | See et al. |
| 6,845,385 B1 | 1/2005 | Hennessey |
| 6,865,659 B2 | 3/2005 | Montemayor |
| 6,877,074 B2 | 4/2005 | Naitoh et al. |
| 6,883,114 B2 | 4/2005 | Lasser |
| 6,886,083 B2 | 4/2005 | Murakami |
| 6,895,464 B2 | 5/2005 | Chow et al. |
| 6,898,662 B2 | 5/2005 | Gorobets |
| 6,925,007 B2 | 8/2005 | Harari et al. |
| 6,938,116 B2 | 8/2005 | Kim et al. |
| 6,965,963 B1 | 11/2005 | Nakanishi et al. |
| 7,003,553 B2 | 2/2006 | Kanai et al. |
| 7,032,065 B2 | 4/2006 | Gonzalez et al. |
| 7,035,949 B2 | 4/2006 | Bychkov et al. |
| 7,092,911 B2 | 8/2006 | Yokota et al. |
| 7,127,549 B2 | 10/2006 | Sinclair |
| 7,136,973 B2 | 11/2006 | Sinclair |
| 7,193,899 B2 | 3/2007 | Eggleston et al. |
| 7,251,747 B1 | 7/2007 | Bean et al. |
| 7,627,733 B2 | 12/2009 | Sinclair |
| 2001/0034809 A1 | 10/2001 | Ogawa |
| 2001/0052038 A1 | 12/2001 | Fallon et al. |
| 2002/0069354 A1 | 6/2002 | Fallon et al. |
| 2002/0078002 A1 | 6/2002 | Bottomley et al. |
| 2002/0083280 A1 | 6/2002 | Naitoh et al. |
| 2002/0099904 A1 | 7/2002 | Conley |
| 2002/0166023 A1 | 11/2002 | Nolan et al. |
| 2002/0178143 A1 | 11/2002 | Fujimoto |
| 2002/0184436 A1 | 12/2002 | Kim et al. |
| 2002/0188592 A1 | 12/2002 | Leonhardt et al. |
| 2003/0002432 A1 | 1/2003 | Morris et al. |
| 2003/0026186 A1 | 2/2003 | Ando et al. |
| 2003/0065866 A1 | 4/2003 | Spencer |
| 2003/0065876 A1 | 4/2003 | Lasser |
| 2003/0065899 A1 | 4/2003 | Gorobets |
| 2003/0088812 A1 | 5/2003 | Lasser |
| 2003/0109093 A1 | 6/2003 | Harari et al. |
| 2003/0128619 A1 | 7/2003 | Roohparvar et al. |
| 2003/0135514 A1 | 7/2003 | Patel et al. |
| 2003/0147278 A1 | 8/2003 | Tanaka et al. |
| 2003/0208501 A1 | 11/2003 | Walter et al. |
| 2003/0229753 A1 | 12/2003 | Hwang |
| 2003/0229769 A1 | 12/2003 | Montemayor |
| 2004/0019716 A1 | 1/2004 | Bychkov et al. |
| 2004/0024921 A1 | 2/2004 | Peake, Jr. et al. |
| 2004/0028068 A1 | 2/2004 | Kizhepat |
| 2004/0040018 A1 | 2/2004 | Fleming et al. |
| 2004/0044873 A1 | 3/2004 | Wong et al. |
| 2004/0073627 A1 | 4/2004 | Amano |
| 2004/0073727 A1 | 4/2004 | Moran et al. |
| 2004/0103241 A1 | 5/2004 | Chang et al. |
| 2004/0123020 A1 | 6/2004 | Gonzalez et al. |
| 2004/0133718 A1 | 7/2004 | Kodama et al. |
| 2004/0157638 A1 | 8/2004 | Moran et al. |

| | | | | | | |
|---|---|---|---|---|---|---|
| 2004/0186946 | A1 | 9/2004 | Lee | WO | WO 2005/066793 A2 | 7/2005 |
| 2004/0205289 | A1 | 10/2004 | Srinivasan | WO | WO 2005/081097 A2 | 9/2005 |
| 2004/0207512 | A1* | 10/2004 | Bastian, II ............... 340/5.92 | WO | WO 2006/088719 A2 | 8/2006 |
| 2004/0248612 | A1 | 12/2004 | Lee | WO | WO 2006/088723 | 8/2006 |
| 2005/0018527 | A1 | 1/2005 | Gorobets | WO | WO 2006/088727 A2 | 8/2006 |
| 2005/0086422 | A1 | 4/2005 | Wong et al. | WO | WO 2007/019075 A2 | 2/2007 |
| 2005/0125600 | A1 | 6/2005 | Ehrlich et al. | WO | WO 2007/076378 A2 | 7/2007 |
| 2005/0125602 | A1 | 6/2005 | Ehrlich | WO | WO 2007/079358 A2 | 7/2007 |
| 2005/0125603 | A1 | 6/2005 | Ehrlich et al. | | | |
| 2005/0141312 | A1 | 6/2005 | Sinclair et al. | | | |
| 2005/0141313 | A1 | 6/2005 | Gorobets et al. | | | |
| 2005/0144357 | A1 | 6/2005 | Sinclair | | | |
| 2005/0144358 | A1 | 6/2005 | Conley et al. | | | |
| 2005/0144360 | A1 | 6/2005 | Bennett et al. | | | |
| 2005/0144363 | A1 | 6/2005 | Sinclair | | | |
| 2005/0144365 | A1 | 6/2005 | Gorobets et al. | | | |
| 2005/0144367 | A1 | 6/2005 | Sinclair | | | |
| 2005/0166087 | A1 | 7/2005 | Gorobets et al. | | | |
| 2005/0172067 | A1 | 8/2005 | Sinclair | | | |
| 2005/0172074 | A1 | 8/2005 | Sinclair | | | |
| 2006/0004951 | A1 | 1/2006 | Rudelic et al. | | | |
| 2006/0020744 | A1 | 1/2006 | Sinclair et al. | | | |
| 2006/0020745 | A1 | 1/2006 | Conley et al. | | | |
| 2006/0031593 | A1 | 2/2006 | Sinclair | | | |
| 2006/0087957 | A1* | 4/2006 | Kelly et al. ............ 369/275.1 | | | |
| 2006/0143365 | A1 | 6/2006 | Kikuchi | | | |
| 2006/0155920 | A1 | 7/2006 | Smith et al. | | | |
| 2006/0155921 | A1 | 7/2006 | Gorobets et al. | | | |
| 2006/0155922 | A1 | 7/2006 | Gorobets et al. | | | |
| 2006/0161724 | A1 | 7/2006 | Bennett et al. | | | |
| 2006/0161728 | A1 | 7/2006 | Bennett et al. | | | |
| 2006/0168392 | A1* | 7/2006 | Hwang ..................... 711/103 | | | |
| 2006/0168395 | A1 | 7/2006 | Deng et al. | | | |
| 2006/0184718 | A1 | 8/2006 | Sinclair et al. | | | |
| 2006/0184719 | A1 | 8/2006 | Sinclair | | | |
| 2006/0184720 | A1 | 8/2006 | Sinclair et al. | | | |
| 2006/0184722 | A1 | 8/2006 | Sinclair | | | |
| 2006/0184723 | A1 | 8/2006 | Sinclair et al. | | | |
| 2007/0030734 | A1 | 2/2007 | Sinclair et al. | | | |
| 2007/0033323 | A1 | 2/2007 | Gorobets | | | |
| 2007/0033324 | A1 | 2/2007 | Sinclair | | | |
| 2007/0033326 | A1 | 2/2007 | Sinclair | | | |
| 2007/0033328 | A1 | 2/2007 | Sinclair et al. | | | |
| 2007/0033329 | A1 | 2/2007 | Sinclair et al. | | | |
| 2007/0033330 | A1 | 2/2007 | Sinclair et al. | | | |
| 2007/0033332 | A1 | 2/2007 | Sinclair et al. | | | |
| 2007/0033373 | A1 | 2/2007 | Sinclair | | | |
| 2007/0033374 | A1 | 2/2007 | Sinclair et al. | | | |
| 2007/0143532 | A1 | 6/2007 | Gorobets et al. | | | |

FOREIGN PATENT DOCUMENTS

| | | |
|---|---|---|
| DE | 102 34 971 A1 | 2/2004 |
| EP | 0 564 699 A1 | 10/1993 |
| EP | 0 702 305 | 3/1996 |
| EP | 1 054 319 | 11/2000 |
| EP | 1054319 | 11/2000 |
| EP | 1100001 | 8/2003 |
| EP | 1 571 557 | 9/2005 |
| JP | 62-283496 | 12/1987 |
| JP | 2002-251310 | 9/2002 |
| JP | 2005 122439 | 5/2005 |
| WO | WO 97/12324 | 4/1997 |
| WO | WO 97/50035 | 12/1997 |
| WO | WO 00/49488 | 8/2000 |
| WO | WO 02/23341 | 3/2002 |
| WO | WO 02/23341 A1 | 3/2002 |
| WO | WO 02/29575 A2 | 4/2002 |
| WO | WO 02/058074 | 7/2002 |
| WO | WO 2004/012027 | 2/2004 |
| WO | WO 2004/040453 A2 | 5/2004 |
| WO | WO 2004/040455 | 5/2004 |
| WO | WO 2004/046937 | 6/2004 |

OTHER PUBLICATIONS

"ISO/IEC, International Standard, Information technology -Identification cards—Integrated circuit(s) with contacts", *Part 4: Interindustry commands for interchange*, ISO/IEC 7816-4, First Edition, Sep. 1, 1995, 46 pages.

Ban, Amir, "Inside Flash File Systems—Part I", *IC Card Systems & Design*, Jul./Aug. 1993, pp. 15-16, 18.

Ban, Amir, "Inside Flash File Systems—Part II", *IC Card Systems & Design*, Sep./Oct. 1993, 21-24.

Ban, Amir, "Local Flash Disks: Two Architectures Compared" *M-Systems Flash Disk Pioneers, White Paper, Rev. 1.0*, Aug. 2001, 9 pages.

Kolowsky, "Introduction to MTP: Media Transfer Protocol" *Cypress Semiconductor*.

Rankl, Wolfgang, "Smart Card Handbook" Third Edition, Translated by Kenneth Cox, *John Wiley & Sons, Ltd.*, 2004, 52-93, 233-369, 435-490.

Non-Final Office Action on co-pending U.S. Appl. No. 11/196,168 dated Nov. 28, 2007.

Official Action for U.S. Appl. No. 11/314,842 (Sep. 15, 2008).

Official Action for U.S. Appl. No. 11/342,168 (Aug. 19, 2008).

Official Action for U.S. Appl. No. 11/060,248 (Aug. 14, 2008).

Official Action for U.S. Appl. No. 11/060,249 (Aug. 4, 2008).

Official Action for U.S. Appl. No. 11/060,174 (Jul. 24, 2008).

Final Official Action for U.S. Appl. No. 11/196,168 (Jul. 24, 2008).

Notification Concerning Transmittal of International Preliminary Report on Patentability for International Application No. PCT/US2006/062341 (Jul. 3, 2008).

Notification Concerning the Transmittal of International Preliminary Report on Patentabilitty for International Application No. PCT/US2006/062340 (Jul. 3, 2008).

Communication pursuant to Article 94(3) EPC corresponding to European Patent Application No. 06 734 659.3 (Jun. 23, 2008).

Final Official Action for U.S. Appl. No. 11/313,567 (May 28, 2008).

Notification Concerning Transmittal of International Preliminary Report on Patentability for International Application No. PCT/US2006/029306 (Feb. 14, 2008).

Interview Summary for U.S. Appl. No. 11/314,842 (Jan. 16, 2008).

Interview Summary for U.S. Appl. No. 11/313,567 (Jan. 16, 2008).

Final Official Action for U.S. Appl. No. 11/060,249 (Dec. 26, 2007).

Official Action for U.S. Appl. No. 11/342,168 (Dec. 26, 2007).

Final Official Action for U.S. Appl. No. 11/060,248 (Dec. 26, 2007).

Official Action for U.S. Appl. No. 11/342,170 (Dec. 14, 2007).

Final Official Action for U.S. Appl. No. 11/060,174 (Dec. 12, 2007).

Official Action for U.S. Appl. No. 11/196,168 (Nov. 28, 2007).

Notification of Transmittal of the International Search Report and the Written Opinion of the International Searching Autohrity, or the Declaration for International Application No. PCT/US2006/062340 (Oct. 29, 2007).

Official Action for U.S. Appl. No. 11/313,567 (Oct. 9, 2007).

Official Action for U.S. Appl. No. 11/314,842 (Oct. 9, 2007).

International Preliminary Report on Patentability for International Application No. PCT/US2006/004585 (Aug. 21, 2007).

International Preliminary Report on Patentability for International Application No. PCT/US2006/004555 (Aug. 21, 2007).

Notification of Transmittal of the International Search Report and the Written Opinion of the International Searching Authority, or the Declaration for International Application No. PCT/US2006/062341 (Jun. 26, 2007).

Official Action for U.S. Appl. No. 11/060,249 (Apr. 13, 2007).

Official Action for U.S. Appl. No. 11/060,248 (Apr. 5, 2007).

Official Action for U.S. Appl. No. 11/060,174 (Mar. 27, 2007).

International Search Report for International Application No. PCT/US2006/004555 (Oct. 4, 2006).
International Search Report for International Application No. PCT/US2006/004585 (Aug. 17, 2006).
Official Action for U.S. Appl. No. 11/313,633 (Oct. 9, 2007).
Notification of Transmittal of the International Search Report and the Written Opinion of the International Searching Authority, or the Declaration for International Application No. PCT/US2006/029306 (Mar. 9, 2007).
Lim et al., "An Efficient NAND Flash File System for Flash Memory Storage," IEEE Transactions on Computer, vol. 55, No. 7, pp. 906-912 (Jul. 1, 2006).
Co-pending U.S. Patent Application entitled "Method and System for Accessing Non-Volatile Storage Devices," U.S. Appl. No. 11/313,633, filed Dec. 22, 2005.
Co-pending U.S. Patent Application entitled "Dual Mode Access for Non-Volatile Storage Devices," U.S. Appl. No. 11/314,842, filed Dec. 21, 2005.
Co-pending U.S. Patent Application entitled "Method and System for Accessing Non-Volatile Storage Devices," U.S. Appl. No. 11/313,567, filed Dec. 21, 2005.
Gal et al. "Algorithms and Data Structures for Flash Memories," ACM Computing Surveys (CSUR) vol. 37, Issue 2, pp. 138-163, (Jun. 2005).
Co-pending U.S. Patent Application entitled Direct File Data Programming and Deletion in Flash Memories,) U.S. Appl. No. 11/060,174, filed Feb. 16, 2005.
Co-pending U.S. Provisional Patent Application entitled "Direct Data File Storage in Flash Memories," U.S. Appl. No. 60/705,388, filed Aug. 3, 2004.
Kim et al., "A Space-Efficient Flash Translation Layer for CompactFlash Systems," IEEE Transactions on Consumer Electronics, vol. 48, No. 2, pp. 366-375, (May 2002).
LAI/The Waite Group, "Writing MS-DOS® Device Drivers," Second Edition, pp. 240-253 (2002).
Kim, et al., "A New Flash Memory Management for Flash Storage System," Computer Software and Applications Conference, 1999. Compsac '99 Proceedings. IEEE Comput. Soc., pp. 284-289 (1999).
Chiang et al., "Cleaning Policies in Mobile Computers Using Flash Memory," Journal of Systems & Software, vol. 48, pp. 213-231, (1999).
Kjelso et al., "Memory Management in Flash-Memory Disks with Data Compression," Springer-Verlag, pp. 399-413 (1995).
Wu et al., "Envy: A Non-Volatile, Main Memory Storage System," ACM Sigplan Notices, vol. 29, No. 11, pp. 86-97, (Nov. 1, 1994).
Hitz, D. et al., "File System Design for an NFS File Server Appliance," Network Appliance Technical Report 3002 Retrieved from http://citeseer.ist.psu.edu/hitz95file.html (Jan. 19, 1994).
Chiang et al., "Data Management in a Flash Memory Based Storage Server," National Chiao-Tung University, Hsinchu, Taiwan, Dept. of Computer and Information Science, 8 pages, (Publication Date Unknown).
PNY Technologies Attache Flash Product, http://www.pny.com/products/flash/attache.asp (Copyright 2003).
Official Action for U.S. Appl. No. 11/314,842 (May 8, 2009).
Interview Summary for U.S. Appl. No. 11/060,249 (May 8, 2009).
Final Official Action for U.S. Appl. No. 11/060,248 (Apr. 28, 2009).
Final Official Action for U.S. Appl. No. 11/060,174 (Apr. 28, 2009).
Final Official Action for U.S. Appl. No. 11/060,249 (Apr. 8, 2009).
Communication pursuant to Article 94(3) EPC for European Application No. 06788725.7 (Mar. 10, 2009).
Official Action for U.S. Appl. No. 11/342,168 (Mar. 4, 2009).
Written Opinion of the International Searching Authority for International Application No. PCT/US2005/000275 (Aug. 7, 2006).
Notice of Allowance and Fee(s) due for U.S. Appl. No. 10/772,855 (Jun. 16, 2006).
Notice of Allowance and Fee(s) due for U.S. Appl. No. 10/772,789 (Jun. 16, 2006).
Official Action for U.S. Appl. No. 10/772,789 (Mar. 24, 2006).
Notice of Allowance and Fee(s) due for U.S. Appl. No. 10/772,855 (Feb. 21, 2006).
Interview Summary for U.S. Appl. No. 11/313,567 (Feb. 2, 2009).
Noting of loss of rights pursuant to Rule 112(1) EPC for European Application No. 06734695.7 (Jan. 21, 2009).
Noting of loss of rights pursuant to Rule 112(1) EPC for European Application No. 067720547.6 (Jan. 20, 2009).
Official Action for U.S. Appl. No. 11/313,567 (Jan. 6, 2009).
Official Action for U.S. Appl. No. 11/196,168 (Dec. 24, 2008).
Official Action for U.S. Appl. No. 11/342,170 (Oct. 17, 2008).
Communication pursuant to Article 94(3) EPC for European Application No. 06734695.7 (May 19, 2008).
Communication pursuant to Article 94(3) EPC for European Application No. 06720547.6 (May 19, 2008).
International Preliminary Report on Patentability for International Application No. PCT/US2006/004658 (Aug. 21, 2007).
International Search Report for International Application No. PCT/US2006/004658 (Aug. 23, 2006).
Interview Summary for U.S. Appl. No. 11/313,567 (Nov. 5, 2009).
Official Action for U.S. Appl. No. 11/314,842 (Oct. 26, 2009).
Official Action for Taiwanese Patent Application No. 095128233 (Aug. 11, 2009).
China State Intellectual Property Office, "First Office Action," corresponding Chinese Patent Application No. 2006800089822.0, mailed on Aug. 5, 2009, 7 pages.
China State Intellectual Property Office, "First Office Action," corresponding Chinese Patent Application No. 200680009222.3, mailed on Jul. 22, 2009, 7 pages.
Notice of Allowance and Fee(s) Due for U.S. Appl. No. 11/196,168 (Jul. 16, 2009).
Official Action for U.S. Appl. No. 11/313,567 (Jun. 15, 2009).
Official Action for U.S. Appl. No. 11/342,170 (May 20, 2009).
China State Intellectual Property Office, "Office Action," corresponding Chinese Patent Application No. 200680089894, mailed on Apr. 24, 2009, 25 pages (including translation).
Imamiya et al., "A 125-mm2 1-Gb NAND Flash Memory with 10-Mbyte/s Program Speed," IEEE Journal of Solid-State Circuits, vol. 37, No. 11, pp. 1493-1501, (Nov. 2002).
Microsoft Computer Dictionary, Microsoft Press, 2002, Fifth Edition, p. 151.
Eshel et al., "Multiple Caching Schemes in a Lan-Attached Server," IP.Com Journal, IP.Com Inc., West Henrietta, NY, US. (Apr. 1, 1995).
International Search Report on corresponding PCT application (PCT/US2006/062341) from International Searching Authority (EPO) dated Jun. 26, 2007.
Written Opinion on corresponding PCT application (PCT/US2006/062341) from International Searching Authority (EPO) dated Jun. 26, 2007.
International Search Report on corresponding PCT application (PCT/US2006/029306) from International Searching Authority (EPO) dated Mar. 9, 2007.
Written Opinion on corresponding PCT application (PCT/US2006/029306) from International Searching Authority (EPO) dated Mar. 9, 2007.
Non-Final Office Action on corresponding U.S. Appl. No. 11/313,567 dated Oct. 9, 2007.
Non-Final Office Action on corresponding U.S. Appl. No. 11/314,842 dated Oct. 9, 2007.
Gal, Eran et al., "Algorithms and Data Structures for Flash Memories", Internet: URL:http://delivery.acm.org/10.1145/1090000/1089735/p138-gal.pdf?kay1=1089735&key2=0271061911
&coll=GUIDE&dl=GUIDE&CFID=1762036
&CFTOKEN=58789463, XP002453935,(Jun. 1, 2005),138-155.
International Search Report on corresponding PCT application (PCT/US2006/062340) from International Searching Authority (EPO) dated Oct. 29, 2007.
Written Opinion on corresponding PCT application (PCT/US2006/062340) from International Searching Authority (EPO) dated Oct. 29, 2007.

* cited by examiner

DIRECT FILE STORAGE SYSTEM

PRIOR ART SYSTEM

| Write Source | Read Destination | Data Accessibility |
|---|---|---|
| File I/F (A) | File I/F (B) | Data is accessible immediately it is written. |
| Logical I/F (C) | Logical I/F (D) | Data is accessible immediately it is written. |
| Logical I/F (E) | Logical I/F (F) | Directory & FAT data is accessible immediately it is written. |
| File I/F (A) | Logical I/F (D) | Data is accessible following receipt of a specific command for the file at the File I/F after the file has been written. Receipt of the command causes a "convert-to-logical" operation for the file to be performed by the device. |
| Logical I/F (C) | File I/F (B) | Data is accessible following detection of an "end of file" condition in the sequence received at E. Detection of this condition causes a "convert-to-file" operation for the file to be performed by the device. |
| File I/F (A) | Logical I/F (F) | Directory and FAT information relating to data written at A is accessible following receipt of a specific command for the file at the File I/F after the file has been written. Receipt of the command causes a "convert-to-logical" operation for the file to be performed by the device. |

FIGURE 3D

| Logical Run | Logical Block Address | Length of LBA Run | Physical Block Address | Physical Sector Address |
|---|---|---|---|---|
| 1 | | | | |
| 2 | | | | |
| 3 | | | | |
| • | | | | |
| • | | | | |
| • | | | | |
| • | | | | |
| • | | | | |
| N | | | | |

DOS INDEX TABLE (DOSIT)

FIGURE 4A

| Logical Run # | Logical Block Address | Length of LBA Run | Physical Block Address | Physical Sector Address |
|---|---|---|---|---|
| 1 | | | | |
| 2 | | | | |
| 3 | | | | |
| • | | | | |
| • | | | | |
| • | | | | |
| N | | | | |

Logical to Physical Table (LPT)

FIGURE 4C

| LBA Run # | LBA for start of LBA Run | LBA Length | File Identifier | File offset |
|---|---|---|---|---|
| 1 | | | | |
| 2 | | | | |
| 3 | | | | |
| • | | | | |
| • | | | | |
| • | | | | |
| N | | | | |

Logical File Table (LFT)

FIGURE 4E

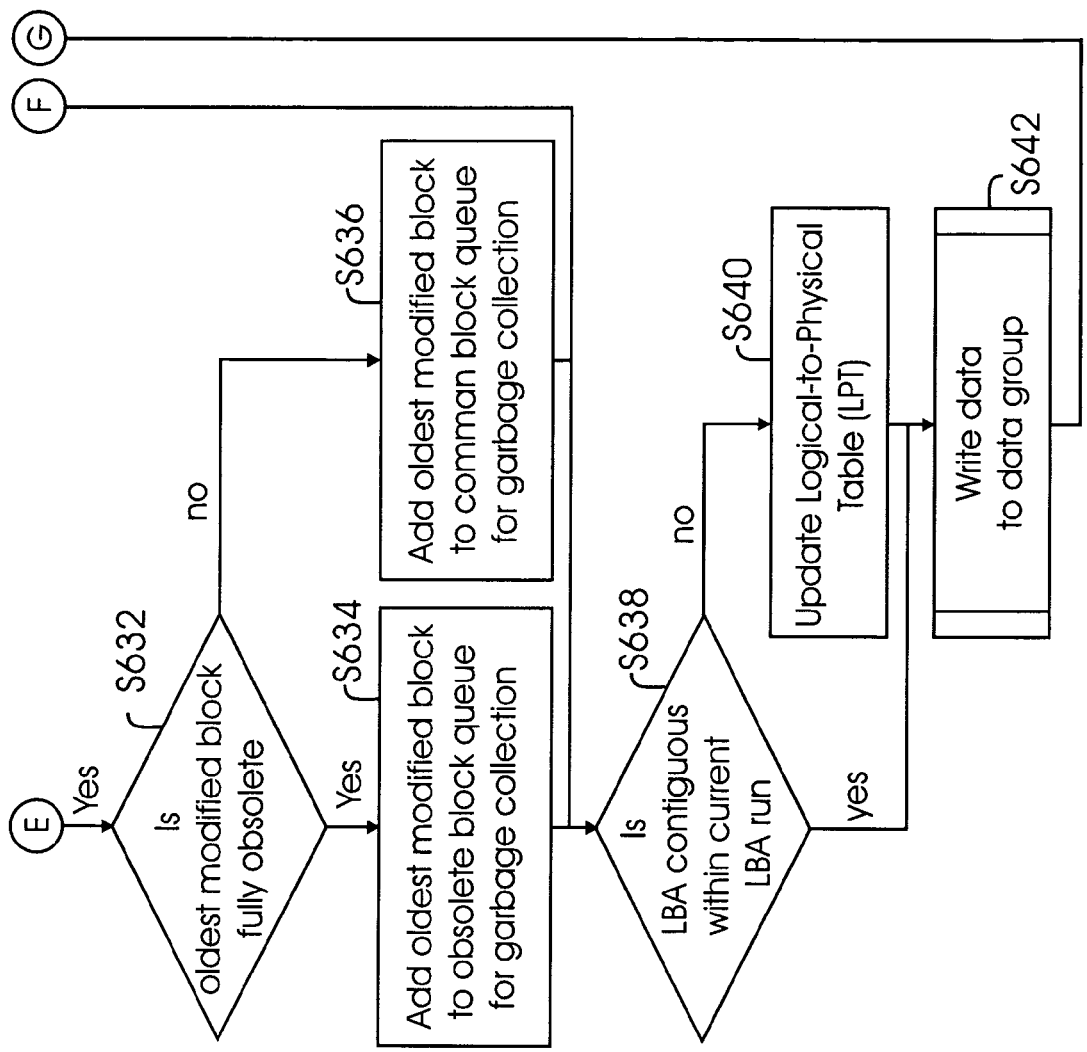
FIGURE 6(iii)

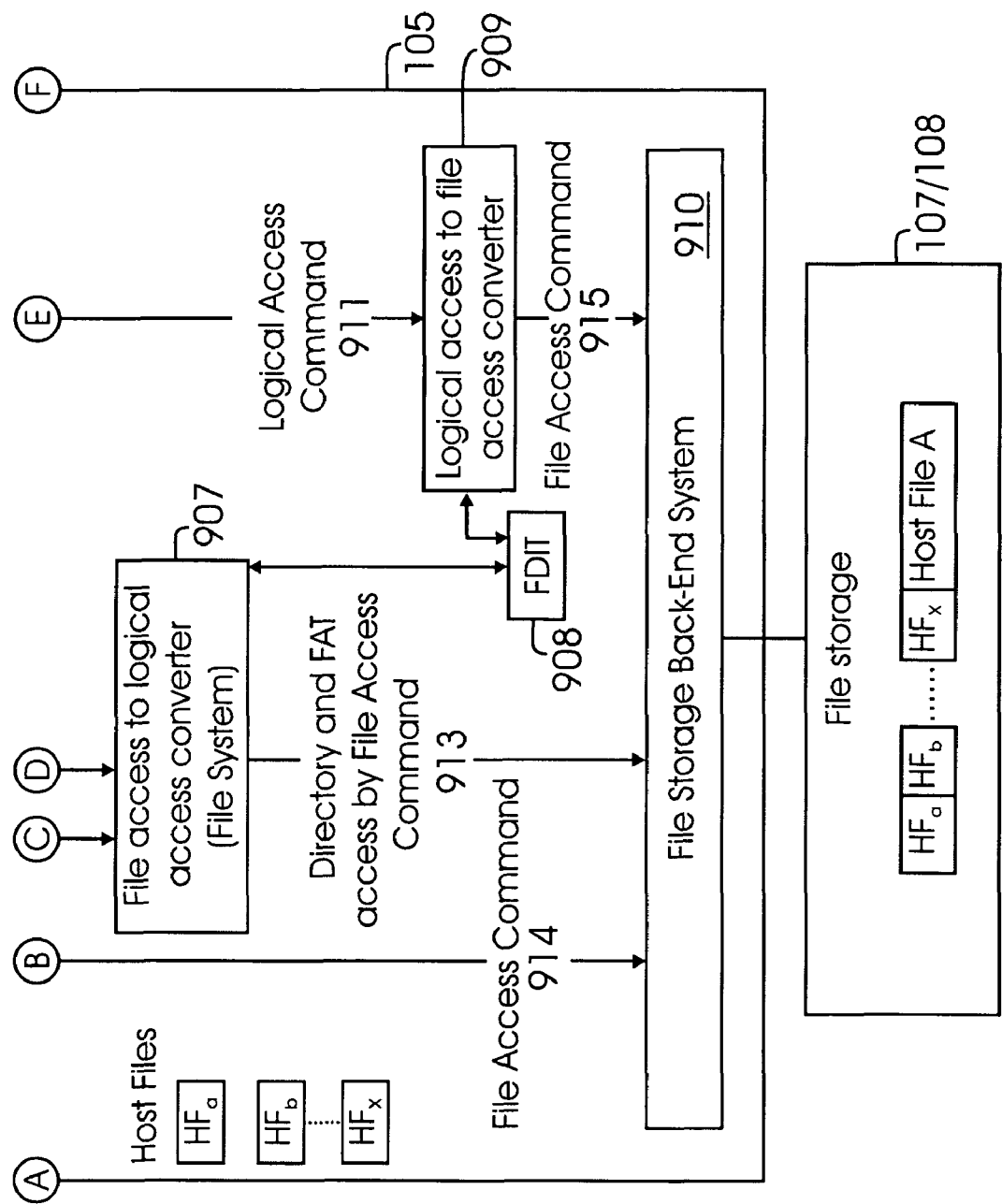
Figure 9A(ii)

| File Name | File offset | Logical Sector Address | Logical Block Address | Internal File Name |
|---|---|---|---|---|
| "A" | <Offset> | | | |
| "B" | | | | |
| "C" | | | | |

METHOD AND SYSTEM FOR ACCESSING NON-VOLATILE STORAGE DEVICES

CROSS REFERENCE TO RELATED APPLICATIONS

This patent application is related to the following co-pending patent applications, incorporated herein by reference in their entirety:

Ser. No. 11/060,249; Filed on Feb. 16, 2005; entitled "Direct Data File Storage in Flash Memories" with Alan W. Sinclair and Peter J. Smith as inventors;

Ser. No. 11/060,174; Filed on Feb. 16, 2005; entitled "Direct Data File Programming and Deletion in Flash Memories", with Alan W. Sinclair and Peter J. Smith as inventors;

Ser. No. 11/060,248; Filed on Feb. 16, 2005; entitled "Direct Data File Storage Implementation Techniques in Flash Memories", with Alan W. Sinclair as inventor;

Provisional patent application filed by Alan W. Sinclair and Barry Wright concurrently herewith, and entitled "Direct Data File Storage in Flash Memories";

Ser. No. 11/196,168, Filed on Aug. 3, 2005, entitled "Method and System for Dual Mode Access for Storage Devices";

Ser. No. 11/314,842, filed on even date herewith, entitled "Dual Mode Access for Non-Volatile Storage Devices";

Ser. No. 11/313,567, filed on even data herewith, entitled "Method and System for Accessing Non-Volatile Storage Devices";

(the foregoing hereinafter collectively referenced as the "Direct Data File Storage Applications").

1. Field Of The Invention

The present invention relates generally to the operation of re-programmable non-volatile memory systems such as semiconductor flash memory, and more particularly, to accessing the flash memory device via plural interfaces.

2. Background

Conventional computer systems typically include several functional components. These components may include a central processing unit (CPU), main memory, input/output ("I/O") devices, and disk drives. In conventional systems, the main memory is coupled to the CPU via a system bus or a local memory bus. The main memory is used to provide the CPU access to data and/or program information that is stored in main memory at execution time. Typically, the main memory is composed of random access memory (RAM) circuits. A computer system with the CPU and main memory is often referred to as a host system.

A host system interfaces with flash mass storage devices (also referred to as "flash device", "flash" or "flash card" interchangeably throughout this specification) via an interface. In an early generation of commercial flash memory systems, a rectangular array of memory cells were divided into a large number of groups of cells that each stored the amount of data of a standard disk drive sector, namely 512 bytes. An additional amount of data, such as 16 bytes, are also usually included in each group to store an error correction code (ECC) and possibly other overhead data relating to the user data and/or to the memory cell group in which it is stored. The memory cells in each such group are the minimum number of memory cells that are erasable together. That is, the erase unit is effectively the number of memory cells that store one data sector and any overhead data that is included. Examples of this type of memory system are described in U.S. Pat. Nos. 5,602,987 and 6,426,893. It is a characteristic of flash memory that the memory cells need to be erased prior to re-programming them with data.

Flash memory systems are most commonly provided in the form of a memory card or flash drive that is removably connected with a variety of hosts such as a personal computer, a camera or the like, but may also be embedded within such host systems.

Typically, a host system maintains a file directory and allocates file data to logical clusters. A host system that uses a logical interface for reading/writing data from/to a flash memory device may be referred to as a legacy host system. The term host system in this context includes legacy flash memory card readers and digital cameras and the like.

In conventional systems, a host maintains a file system and allocates file data to logical clusters, where the cluster size is typically fixed. A flash device is divided into plural logical sectors and the host allocates space within the clusters comprising of a plurality of logical sectors. A cluster is a sub-division of logical addresses and a cluster map is designated as a file allocation table ("FAT"). The FAT is normally stored on a storage device itself.

In conventional systems, when writing data to the memory, the host typically assigns unique logical addresses to sectors, clusters or other units of data within a continuous virtual address space of the memory system. Like a disk operating system (DOS), the host writes data to, and reads data from, addresses within the logical address space of the memory system. A controller within the memory system translates logical addresses received from the host into physical addresses within the memory array, where the data are actually stored, and then keeps track of these address translations. The data storage capacity of the memory system is at least as large as the amount of data that is addressable over the entire logical address space defined for the memory system.

Other file storage systems (or formats) are being developed so that a host does not have to perform the file to logical address mapping. However, these new file systems may still have to be used with legacy host systems for reading/writing data.

Therefore, there is a need for a method and system that allows a flash device to be accessed via a conventional logical interface or these new formats where a host does not perform the file to logical mapping.

SUMMARY OF THE INVENTION

In one aspect of the present invention, a method for transferring data between a host system and a re-programmable non-volatile mass storage system having memory cells organized into blocks of memory cells is provided. The method includes receiving individual files of data identified by unique file identifiers, wherein the mass storage system receives the individual files of data via a first interface and stores the received files of data indexed by the unique file identifiers; allocating a plurality of logical block addressees to a received file data; and updating a file allocation table ("FAT") entries in the plurality of memory cells, so that the received file data can be accessible via a second interface.

In another aspect of the present invention, a method for transferring data between a host system and a re-programmable non-volatile mass storage system having memory cells organized into blocks of memory cells is provided. The method includes, receiving data identified by plurality of logical addresses from the host system via a first interface, wherein the mass storage system receives the data; and identifying the data with file identifiers, so that the data can be accessible via a second interface, even if a file name for the data is not provided by the host system.

In yet another aspect of the present invention, a method for transferring data between a host system and a re-programmable non-volatile mass storage system having memory cells organized into blocks of memory cells is provided. The method includes receiving data identified by a plurality of logical addresses from the host system via a first interface, wherein the mass storage system receives the data; identifying the data with file identifiers, so that the data can be accessible via a second interface even if a file name is not provided by the host system; storing data as internal files having unique file names; and merging the internal files with unique file names into a single file after a host file name for the data is received.

In another aspect of the present invention, a method for transferring data between a host system and a re-programmable non-volatile mass storage system having memory cells organized into blocks of memory cells is provided. The method includes receiving data via a first interface and/or a second interface; and making data accessible via the first interface and the second interface, even if a file name is not provided by a host system or before a write operation is complete.

This brief summary has been provided so that the nature of the invention may be understood quickly. A more complete understanding of the invention can be obtained by reference to the following detailed description of the preferred embodiments thereof in connection with the attached drawings.

BRIEF DESCRIPTION OF THE DRAWINGS

The foregoing features and other features of the present invention will now be described with reference to the drawings of a preferred embodiment. In the drawings, the same components have the same reference numerals. The illustrated embodiment is intended to illustrate, but not to limit the invention. The drawings include the following Figures:

FIG. 3D shows a table with data accessibility rules for the mass storage device; according to one aspect of the present invention;

FIG. 4A shows a DOS index table, according to one aspect of the present invention;

FIG. 4C shows an example of a logical to physical table, according to one aspect of the present invention;

FIG. 4E shows an example of a logical to file table, according to one aspect of the present invention;

FIG. 10A shows an example of a table used by the system of FIGS. 9A and 9B, according to one aspect of the present invention;

DETAILED DESCRIPTION OF THE PREFERRED EMBODIMENTS

To facilitate an understanding of the preferred embodiment, the general architecture and operation of a host system/flash device will be described. The specific architecture and operation of the preferred embodiment will then be described with reference to the general architecture.

Figure 1A:
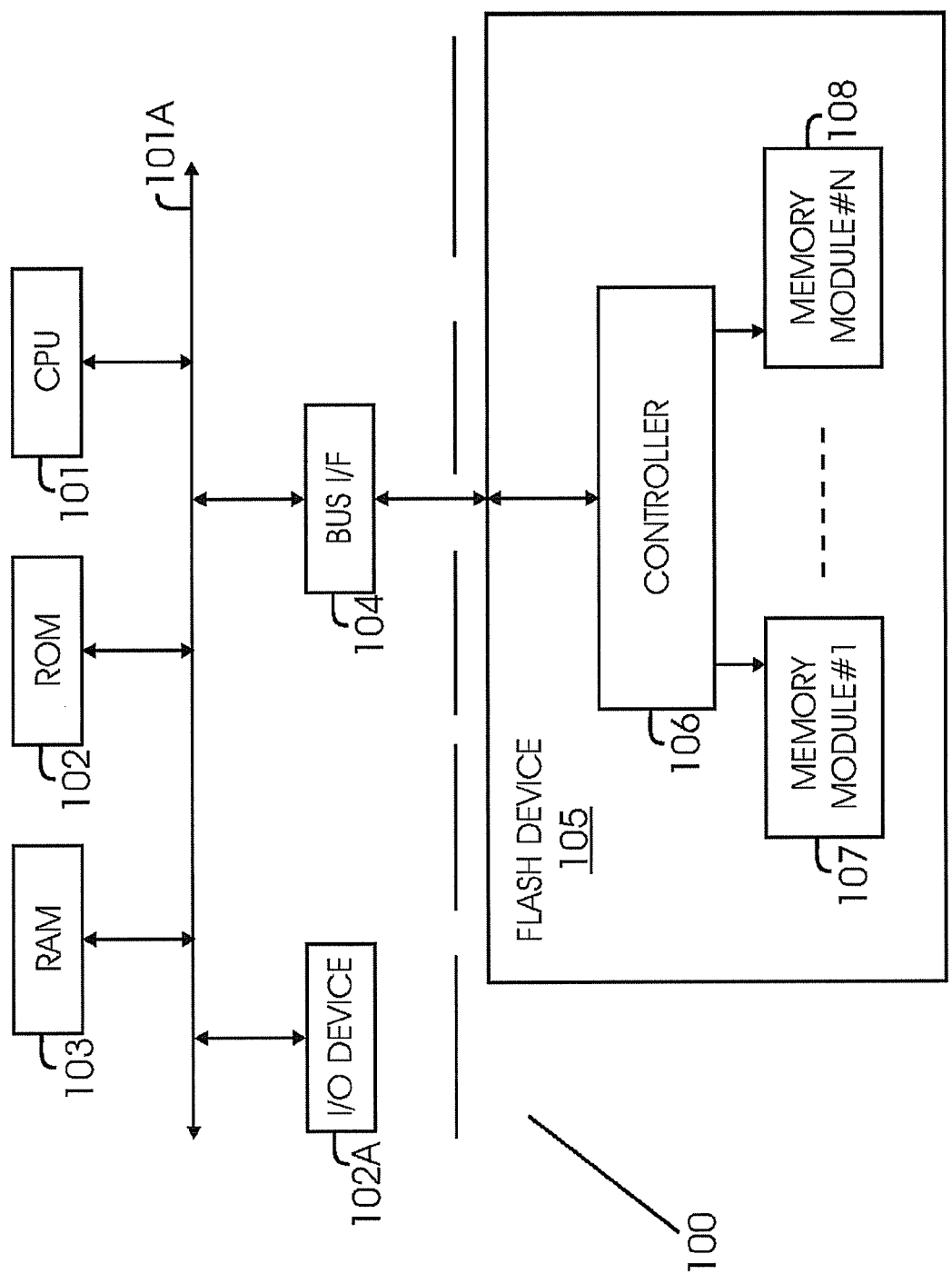
FIG. 1A shows a block diagram of a host system using a flash device.

Host System/Flash Controller:

FIG. 1A shows a block diagram of a typical host system 100 that includes a central processing unit ("CPU") (or microprocessor) 101 connected to a system bus 101A. Random access main memory ("RAM") 103 is also coupled to system bus 101A and provides CPU 101 with access to memory storage. When executing program instructions, CPU 101 stores those process steps in RAM 103 and executes the stored process steps out of RAM 103.

Read only memory ("ROM") 102 is provided to store invariant instruction sequences such as start-up instruction sequences or basic Input/output operating system (BIOS) sequences.

Input/Output ("I/O") devices 102A, for example, a keyboard, a pointing device ("mouse"), a monitor, a modem and the like are also provided.

Flash device (or card) 105 also provides non-volatile memory for CPU 101. Flash device 105 includes a controller module 106 (may also be referred to as "memory system controller") and solid state memory modules 107-108 (shown as Memory Module #1 and Memory Module #N). Controller module 106 interfaces with host system 100 via a bus interface 104 or directly via system bus 101A or another peripheral bus (not shown).

There are currently many different flash memory cards that are commercially available, examples being the Compact-Flash (CF), the MultiMediaCard (MMC), Secure Digital (SD), miniSD, Memory Stick, SmartMedia and TransFlash cards. Although each of these cards has a unique mechanical and/or electrical interface according to its standardized specifications, the flash memory included in each is very similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

Host systems that use such memory cards and flash drives are many and varied. They include personal computers (PCs), laptop and other portable computers, cellular telephones, personal digital assistants (PDAs), digital still cameras, digital movie cameras and portable audio players. The host typically includes a built-in receptacle for one or more types of memory cards or flash drives but some require adapters into which a memory card is plugged.

A NAND architecture of the memory cell arrays 107-108 is currently preferred, although other architectures, such as NOR, can also be used instead. Examples of NAND flash memories and their operation as part of a memory system may be had by reference to U.S. Pat. Nos. 5,570,315, 5,774,397, 6,046,935, 6,373,746, 6,456,528, 6,522,580, 6,771,536 and 6,781,877 and United States patent application publication no. 2003/0147278.

It is noteworthy that the adaptive aspects of the present invention are not limited to a flash device 105, and can be used for any non-volatile mass storage system.

Figure 1B:
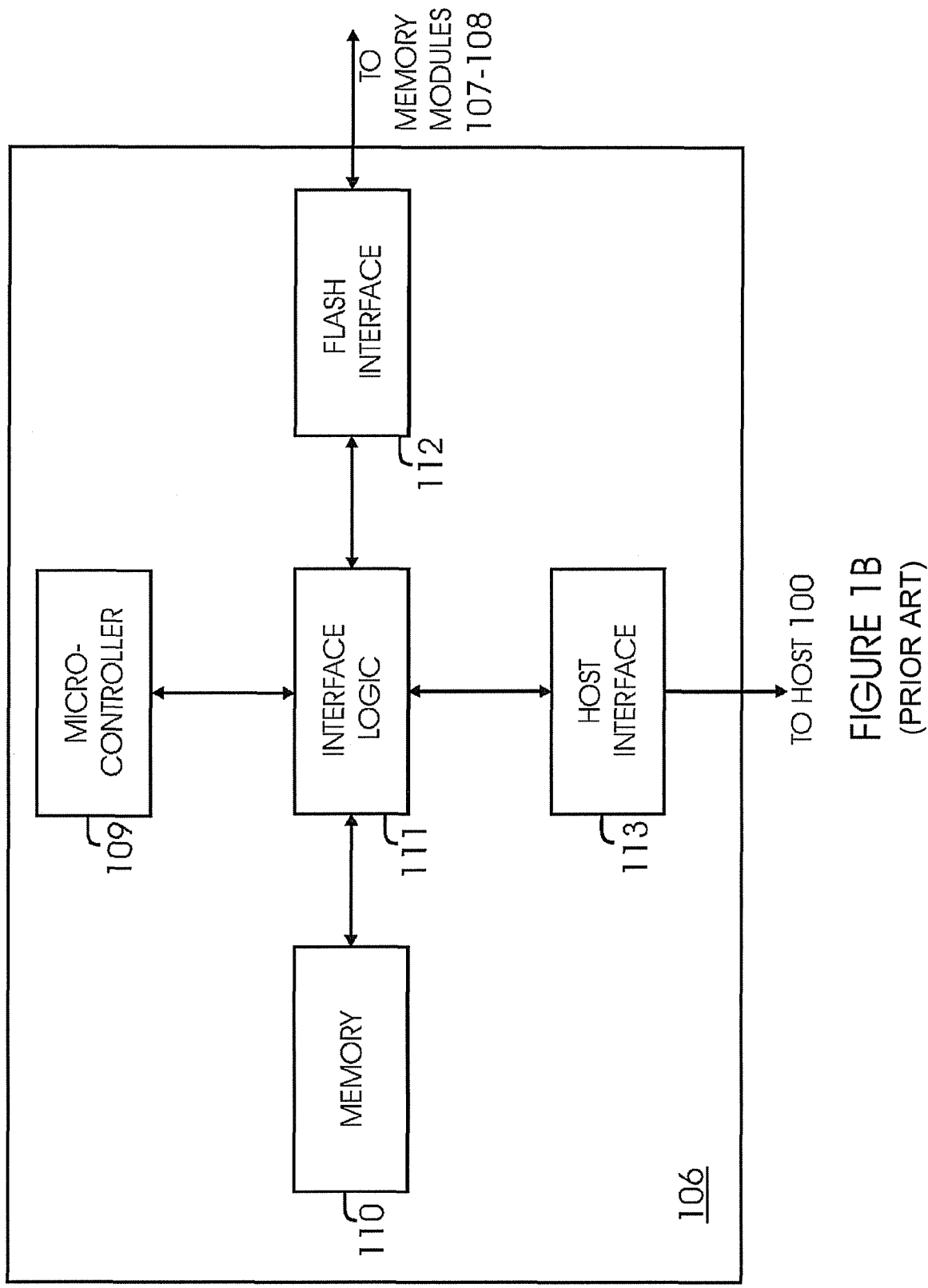
FIG. 1B shows a block diagram of a flash device controller, used according to one aspect of the present invention.

FIG. 1B shows a block diagram of the internal architecture of controller module 106. Controller module 106 includes a microcontroller 109 that interfaces with various other components via interface logic 111. Memory 110 stores firmware and software instructions that are used by microcontroller 109 to control the operation of flash device 105. Memory 110 may be volatile re-programmable random access memory ("RAM"), a non-volatile memory that is not re-programmable ("ROM"), a one-time programmable memory or a re-programmable flash electrically-erasable and programmable read-only memory ("EEPROM").

A host interface 113 interfaces with host system 100, while a flash interface 112 interfaces with memory modules 107-108.

Figure 1C:
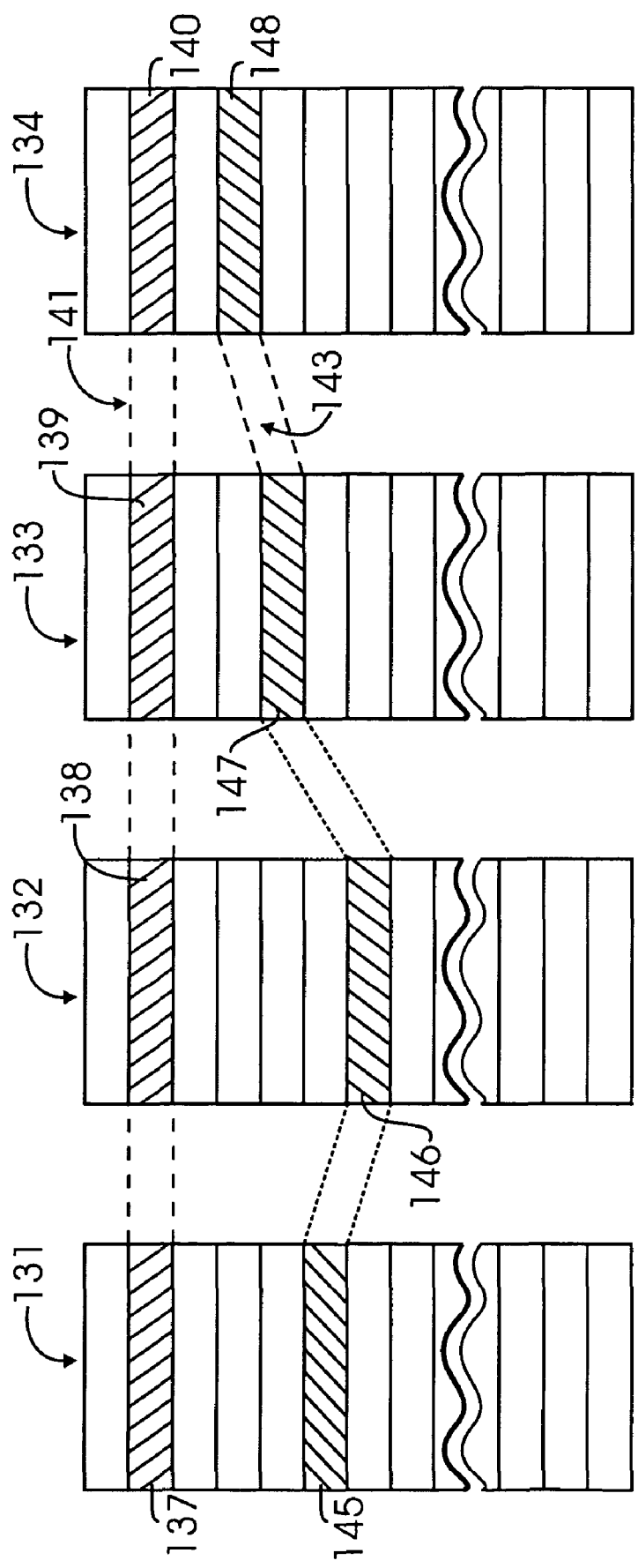
FIG. 1C shows an of example physical memory organization for a flash memory system.

FIG. 1C conceptually illustrates an organization of the flash memory cell array (107-108) that is used as an example in further descriptions below. Four planes or sub-arrays 131-134 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into blocks of memory cells shown in FIG. 1C by rectangles, such as blocks 137, 138, 139 and 140, located in respective planes 131-134. There can be dozens or hundreds of blocks in each plane.

A block of memory cells is the unit of erase, the smallest number of memory cells that are physically erasable together. For increased parallelism, however, the blocks are operated in larger metablock units. One block from each plane is logically linked together to form a metablock. The four blocks 137-140 are shown to form one metablock 141. All of the cells within a metablock are typically erased together. The blocks used to form a metablock need not be restricted to the same relative locations within their respective planes, as is shown in a second metablock 143 made up of blocks 145-148.

Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

Figure 1D:
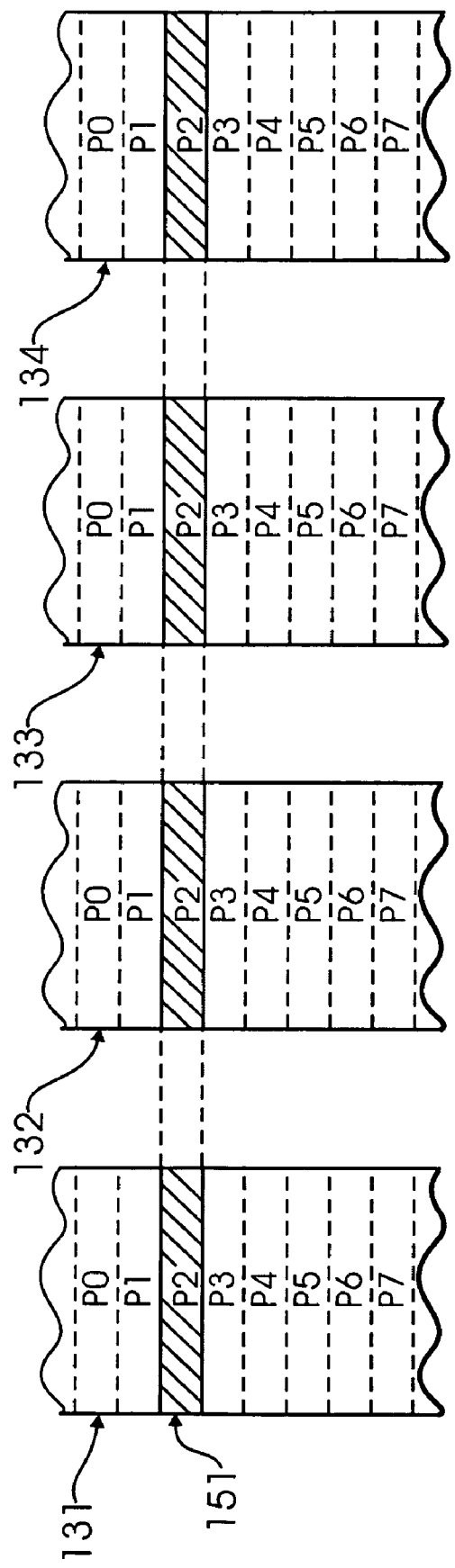
FIG. 1D shows an expanded view of a portion of the physical memory of FIG. 1C.

The individual blocks are in turn divided for operational purposes into pages of memory cells, as illustrated in FIG. 1D. The memory cells of each of the blocks 131-134, for example, are each divided into eight pages P0-P7. Alternatively, there may be 16, 32 or more pages of memory cells within each block. The page is the unit of data programming and reading within a block, containing the minimum amount of data that are programmed at one time.

In the NAND architecture, a page is formed of memory cells along a word line within a block. However, in order to increase the memory system operational parallelism, such pages within two or more blocks may be logically linked into metapages. A metapage 151 is illustrated in FIG. 1D, being formed of one physical page from each of the four blocks 131-134. The metapage 151, for example, includes the page P2 in of each of the four blocks but the pages of a metapage need not necessarily have the same relative position within each of the blocks.

Although it is preferable to program and read the maximum amount of data in parallel across all four planes, for high system performance, the memory system can also be operated to form metapages of any or all of one, two or three pages in separate blocks in different planes. This allows the programming and reading operations to adaptively match the amount of data that may be conveniently handled in parallel and reduces the occasions when part of a metapage remains unprogrammed with data.

A metapage formed of physical pages of multiple planes, as illustrated in FIG. 1D, contains memory cells along word line rows of those multiple planes. Rather than programming all of the cells in one word line row at the same time, they are more commonly alternately programmed in two or more interleaved groups, each group storing a page of data (in a single block) or a metapage of data (across multiple blocks). By programming alternate memory cells at one time, a unit of peripheral circuits including data registers and a sense amplifier need not be provided for each bit line but rather are time-shared between adjacent bit lines. This economizes on the amount of substrate space required for the peripheral circuits and allows the memory cells to be packed with an increased density along the rows. Otherwise, it is preferable to simultaneously program every cell along a row in order to maximize the parallelism available from a given memory system.

Figure 1E:
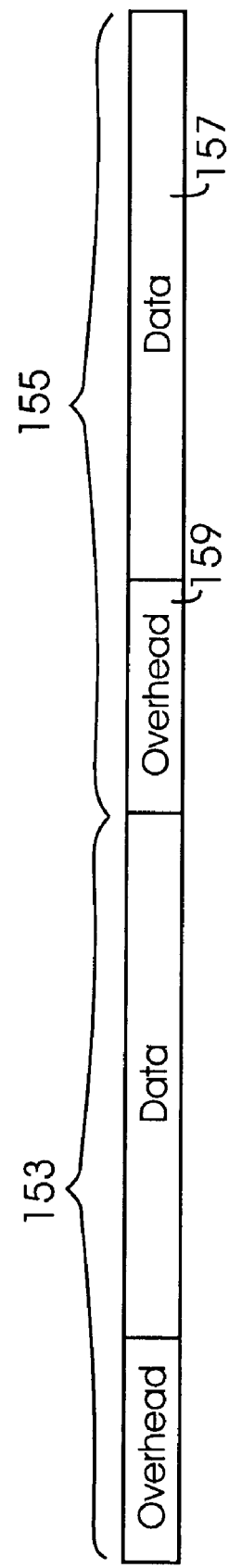
FIG. 1E shows a further expanded view of a portion of the physical memory of FIG. 1D.

FIG. 1E shows a logical data page of two sectors 153 and 155 of data of a page or metapage. Each sector usually contains a portion 157 of 512 bytes of user or system data being stored and another number of bytes 159 for overhead data related either to the data in the portion 157 or to the physical page or block in which it is stored. The number of bytes of overhead data is typically 16 bytes, making the total 528 bytes for each of the sectors 153 and 155. The overhead portion 159 may contain an ECC calculated from the data portion 157 during programming, its logical address, an experience count of the number of times the block has been erased and re-programmed, one or more control flags, operating voltage levels, and/or the like, plus an ECC calculated from such overhead data 159. Alternatively, the overhead data 159, or a portion of it, may be stored in different pages in other blocks.

As the parallelism of memories increases, data storage capacity of the metablock increases and the size of the data page and metapage also increase as a result. The data page may then contain more than two sectors of data. With two sectors in a data page, and two data pages per metapage, there are four sectors in a metapage. Each metapage thus stores 2048 bytes of data. This is a high degree of parallelism, and can be increased even further as the number of memory cells in the rows is increased. For this reason, the width of flash memories is being extended in order to increase the amount of data in a page and a metapage.

The physically small re-programmable non-volatile memory cards and flash drives identified above are commercially available with data storage capacity of 512 megabytes (MB), 1 gigabyte (GB), 2 GB and 4 GB, and may go higher.

Figure 1F:
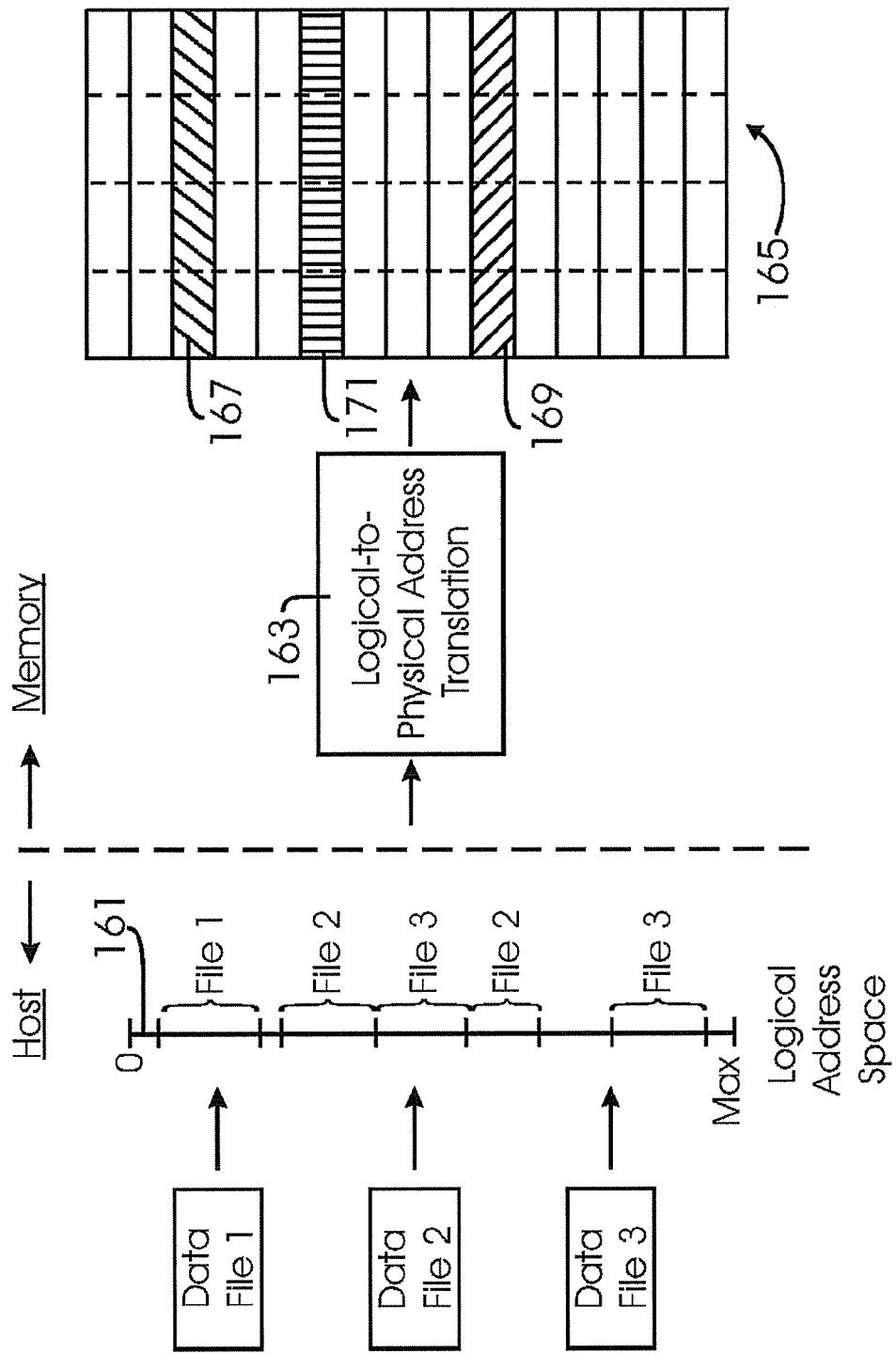
FIG. 1F shows a conventional logical address interface between a host and a re-programmable memory system.

FIG. 1F illustrates the most common interface between a host and a mass memory system (for example, a flash device). The host deals with data files generated or used by application software or firmware programs executed by the host. A word processing data file is an example, and a drawing file of computer aided design (CAD) software is another, found mainly in general computer hosts such as PCs, laptop computers and the like. A document in the pdf format is also such a file. A still digital video camera generates a data file for each picture that is stored on a memory card. A cellular telephone utilizes data from files on an internal memory card, such as a telephone directory. A PDA stores and uses several different files, such as an address file, a calendar file, and the like. In any such application, the memory card may also contain software that operates the host.

A common logical interface between the host and the memory system is illustrated in FIG. 1F. A continuous logical address space 161 is large enough to provide addresses for all the data that may be stored in the memory system. The host address space is typically divided into increments of clusters of data. Each cluster may be designed in a given host system to contain a number of sectors of data, somewhere between 4 and 64 sectors being typical. A standard sector contains 512 bytes of data.

Three Files 1, 2 and 3 are shown in the example of FIG. 1F to have been created. An application program running on the host system creates each file as an ordered set of data and identifies it by a unique name or other reference. Enough available logical address space not already allocated to other files is assigned by the host to File 1. File 1 is shown to have been assigned a contiguous range of available logical addresses. Ranges of addresses are also commonly allocated for specific purposes, such as a particular range for the host operating software, which are then avoided for storing data even if these addresses have not been utilized at the time the host is assigning logical addresses to the data.

When a File 2 is later created by the host, the host similarly assigns two different ranges of contiguous addresses within the logical address space 161, as shown in FIG. 1F. A file need not be assigned contiguous logical addresses but rather can be fragments of addresses in between address ranges already allocated to other files. This example then shows that yet another File 3 created by the host is allocated other portions of the host address space not previously allocated to the Files 1 and 2 and other data.

The host keeps track of the memory logical address space by maintaining a file allocation table (FAT), where the logical addresses the host assigns to the various host files are maintained. The FAT table is typically stored in the non-volatile memory, as well as in a host memory, and is frequently updated by the host as new files are stored, other files deleted, files modified and the like. When a host file is deleted, for example, the host then de-allocates the logical addresses previously allocated to the deleted file by updating the FAT table to show that they are now available for use with other data files.

The host is not concerned about the physical locations where the memory system controller chooses to store the files. The typical host only knows its logical address space and the logical addresses that it has allocated to its various files. The memory system, on the other hand, through a typical host/card interface, only knows the portions of the logical address space to which data have been written but does not know the logical addresses allocated to specific host files, or even the number of host files. The memory system controller 106 converts the logical addresses provided by the host for the storage or retrieval of data into unique physical addresses within the flash memory cell array where host data are stored. A block 163 represents a working table of these logical-to-physical address conversions, which is maintained by the memory system controller 106.

The memory system controller 106 is programmed to store data files within the blocks and metablocks of a memory array 165 in a manner to maintain the performance of the system at a high level. Four planes or sub-arrays are used in this illustration. Data are preferably programmed and read with the maximum degree of parallelism that the system allows, across an entire metablock formed of a block from each of the planes. At least one metablock 167 is usually allocated as a reserved block for storing operating firmware and data used by the memory controller. Another metablock 169, or multiple metablocks, may be allocated for storage of host operating software, the host FAT table and the like. Most of the physical storage space remains for the storage of data files.

The memory system controller 106 does not know, however, how the data received has been allocated by the host among its various file objects. All the memory controller 106 typically knows from interacting with the host is that data written by the host to specific logical addresses are stored in corresponding physical addresses as maintained by the controller's logical-to-physical address table 163.

In a typical memory system, a few extra blocks of storage capacity are provided than are necessary to store the amount of data within the address space 161. One or more of these extra blocks may be provided as redundant blocks for substitution for other blocks that may become defective during the lifetime of the memory. The logical grouping of blocks contained within individual metablocks may usually be changed for various reasons, including the substitution of a redundant block for a defective block originally assigned to the metablock. One or more additional blocks, such as metablock 171, are typically maintained in an erased block pool.

When the host writes data to the memory system, the controller 106 converts the logical addresses assigned by the host to physical addresses within a metablock in the erased block pool. Other metablocks not being used to store data within the logical address space 161 are then erased and designated as erased pool blocks for use during a subsequent data write operation.

Data stored at specific host logical addresses are frequently overwritten by new data as the original stored data become obsolete. The memory system controller 106, in response, writes the new data in an erased block and then changes the logical-to-physical address table for those logical addresses to identify the new physical block to which the data at those logical addresses are stored. The blocks containing the original data at those logical addresses are then erased and made available for the storage of new data. Such erasure often must take place before a current data write operation may be completed if there is not enough storage capacity in the pre-erased blocks from the erase block pool at the start of writing. This can adversely impact the system data programming speed. The memory controller 106 typically learns that data at a given logical address has been rendered obsolete by the host only when the host writes new data to their same logical address. Many blocks of the memory can therefore be storing such invalid data for a time.

The sizes of blocks and metablocks are increasing in order to efficiently use the area of the integrated circuit memory chip. This results in a large proportion of individual data writes storing an amount of data that is less than the storage capacity of a metablock, and in many cases even less than that of a block. Since the memory system controller 106 normally directs new data to an erased pool metablock, this can result in portions of metablocks going unfilled. If the new data are updates of some data stored in another metablock, remaining valid metapages of data from that other metablock having logical addresses contiguous with those of the new data metapages are also desirably copied in logical address order into the new metablock. The old metablock may retain other valid data metapages. This results over time in data of certain metapages of an individual metablock being rendered obsolete and invalid, and replaced by new data with the same logical address being written to a different metablock.

In order to maintain enough physical memory space to store data over the entire logical address space 161, such data are periodically compacted or consolidated (garbage collection). It is also desirable to maintain sectors of data within the metablocks in the same order as their logical addresses as much as practical, since this makes reading data in contiguous logical addresses more efficient. So data compaction and garbage collection are typically performed with this additional goal. Some aspects of managing a memory when receiving partial block data updates and the use of metablocks are described in U.S. Pat. No. 6,763,424.

Direct Data File Storage ("DFS")

A direct data file storage ("DFS") methodology/system is disclosed in co-pending patent application Ser. No. 11/060, 249; Filed on Feb. 16, 2005; entitled "Direct Data File Storage in Flash Memories" and also in other the Direct Data File Storage Applications referenced above.

In a DFS device, data is accessed by host system 100 on a file-by-file basis as described in the aforementioned patent application, that is, data is identified by a file identifier and an offset address within the file. No logical address space is defined for the device. Host system 100 does not allocate file data to logical clusters, and directory/index table information for files is generated by flash device 105.

The host addresses each file by a unique file ID (or other unique reference) and offset addresses of units of data (such as bytes) within the file. This file address is given directly to the memory system controller 106, which then keeps its own table of where the data of each host file are physically stored.

Figure 1G:
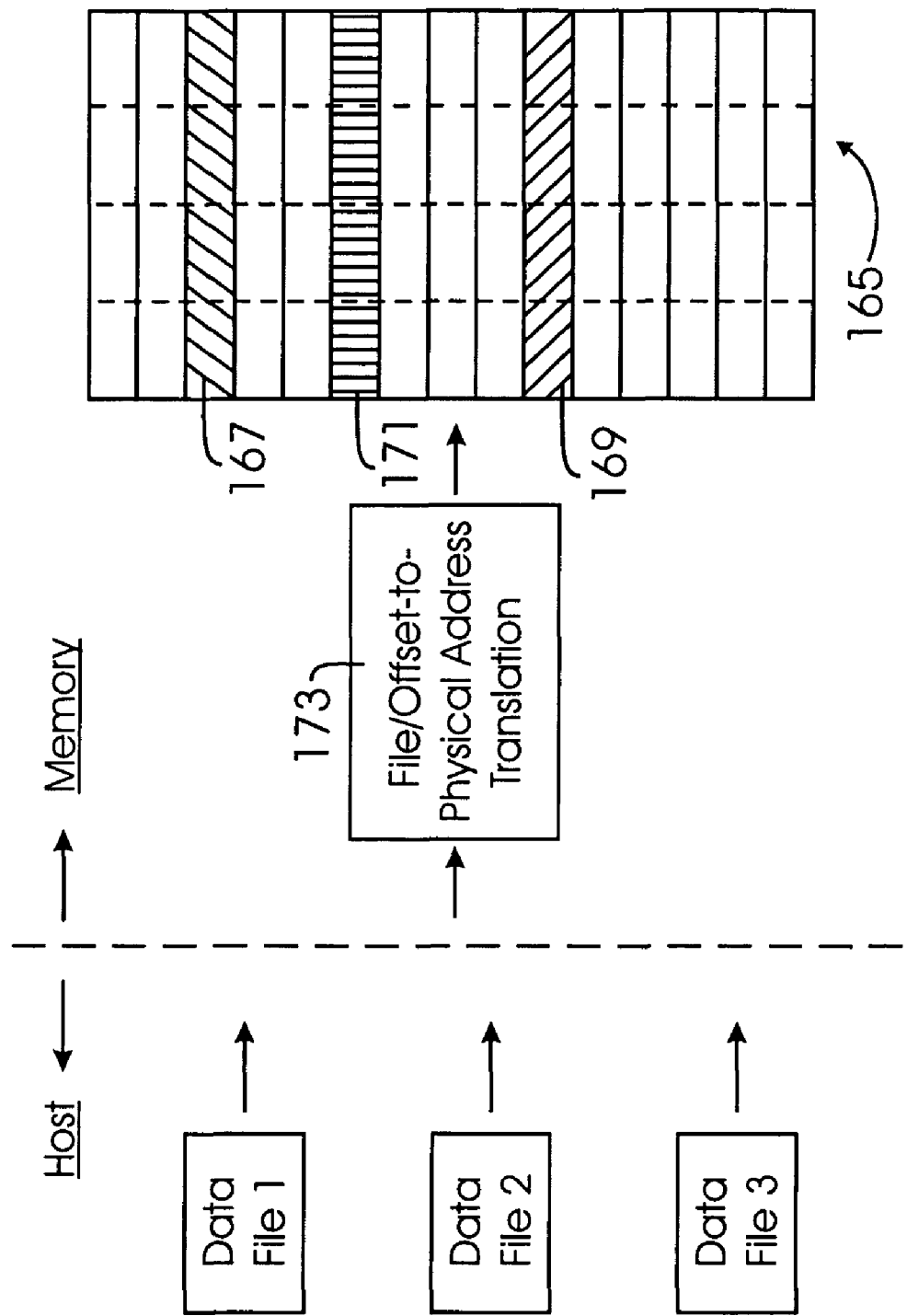
FIG. 1G shows a direct data file storage interface between a host and a re-programmable memory system, according to one aspect of the present invention.

This file-based interface is illustrated in FIG. 1G, which should be compared with the logical address interface of FIG. 1F. An identification of each of the Files 1, 2 and 3 and offsets of data within the files of FIG. 1G are passed directly to the memory controller 106. This logical address information is then translated by a memory controller function 173 into physical addresses of metablocks and metapages of the memory 165.

Figures 1H, 1L:
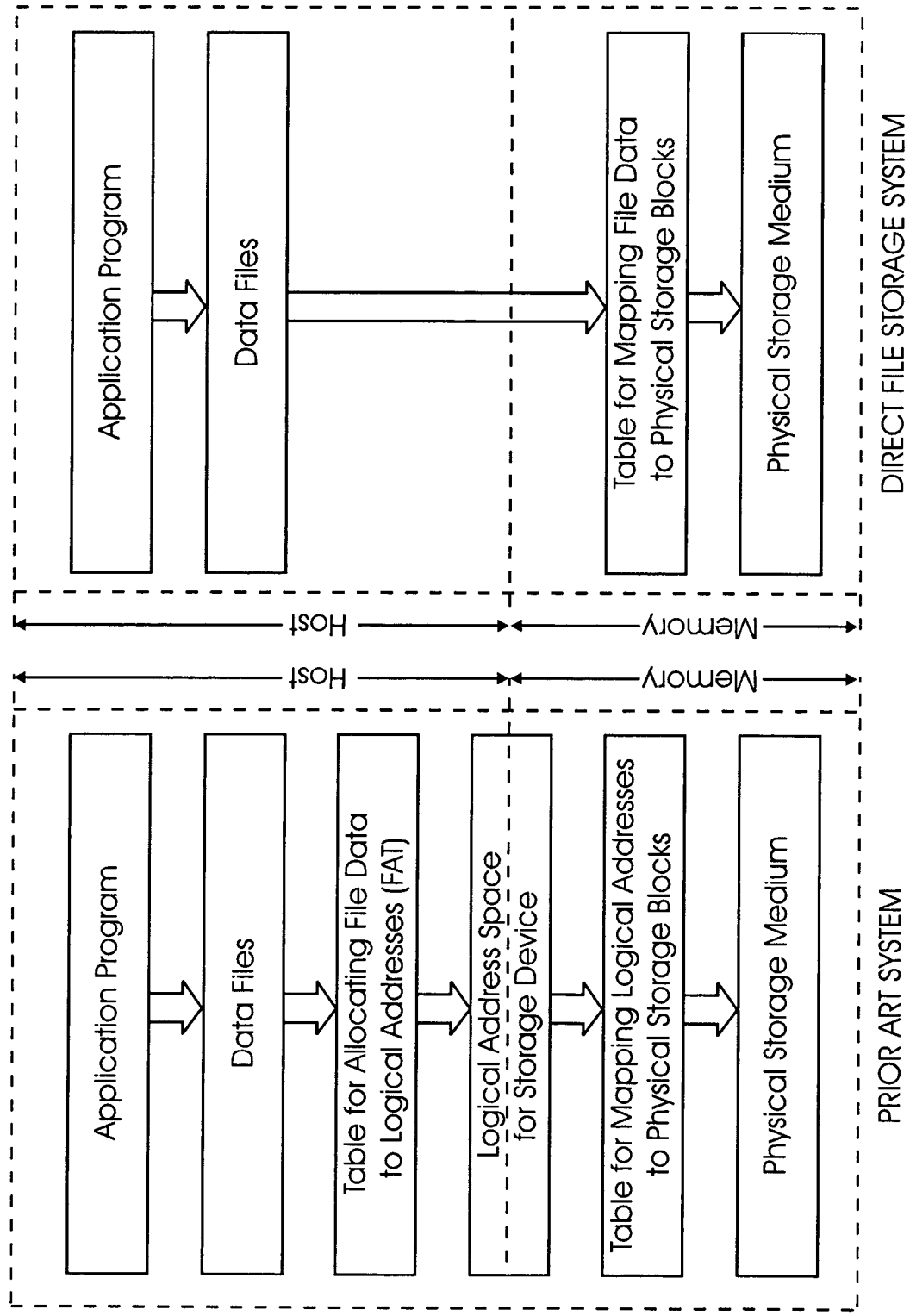
FIG. 1H shows in a different manner than FIG. 1F a conventional logical address interface between a host and a re-programmable memory system.
FIG. 1L shows in a different manner than FIG. 1G, a direct data file storage interface between a host and a re-programmable memory system, according to one aspect of the present invention.

The file-based interface is also illustrated by FIG. 1L, which should be compared with the logical address interface of FIG. 1H. The logical address space and host maintained FAT table of FIG. 1H are not present in FIG. 1L. Rather, data files generated by the host are identified to the memory system by file number and offsets of data within the file. The memory system then directly maps the files to the physical blocks of the memory cell array.

Figure 1M:
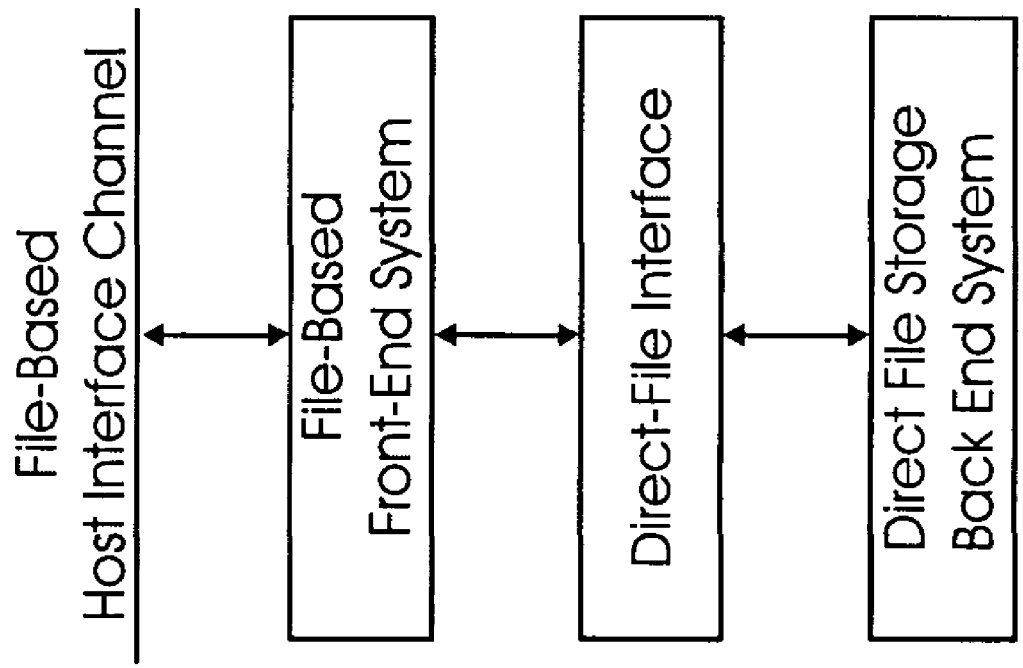
FIG. 1M shows a functional hierarchy of an example memory system.

With reference to FIG. 1M, functional layers of an example mass storage system being described herein are illustrated. The "Direct File Storage Back End System" communicates through a "Direct-File Interface" and a "File-Based Front-End System" with a host system over a file-based interface channel. Each host file is uniquely identified, such as by a file name. Data within a file are identified by an offset address within a linear address space that is unique to the file.

Although DFS devices will be used advantageously by host systems, legacy host systems will need to use a logical interface to read and write data files. Therefore, it is advantageous to have a direct file storage device accessible for read and write operations via dual interfaces, namely, a file interface and a conventional logical interface.

Direct Data File Access: Details of direct data file access, i.e., when flash device 105 operates as a direct data file storage device, are described in the aforementioned co-pending patent application.

Figure 2:
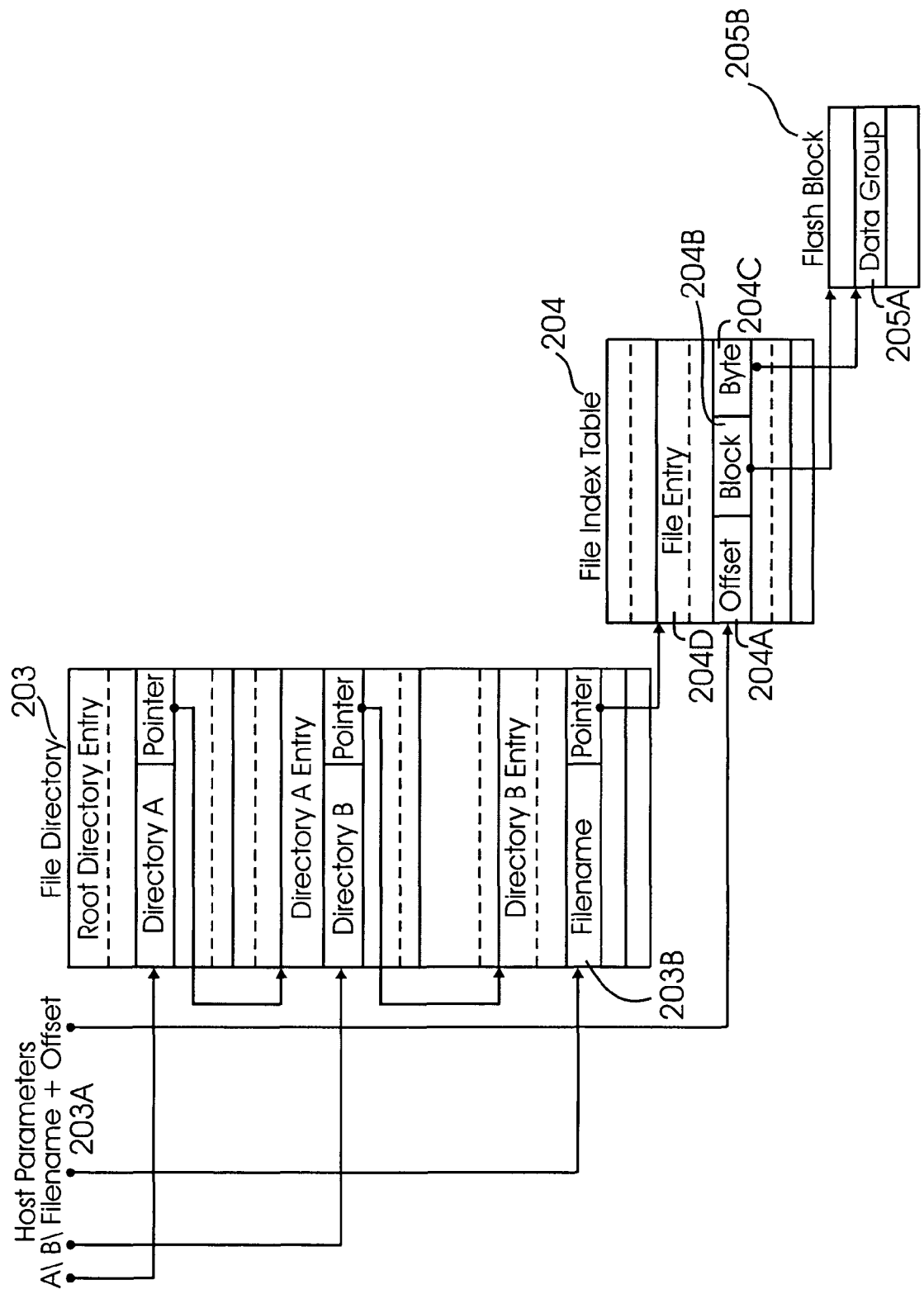
FIG. 2 shows a top-level logical block diagram of a system used by a flash device, according to one aspect of the present invention.

FIG. 2 shows a block diagram of an indexing scheme of a direct data file storage system used according to one aspect of the present invention. Host 100 provides a path, filename and offset 203A (<fileId> parameter) to flash device 105 via file interface (shown as 300 in FIG. 3A). The path points to a file directory 203 that stores the directory information, for example, Directory A and B.

The <fileID> parameter can be either a full pathname for the file, or some shorthand identifier for the file, and may be referenced as a file_handle. A file pathname is provided to the direct data file interface of FIG. 1M in association with certain commands. This allows a fully explicit entry to be created in the file directory to be accessed when an existing file is opened.

The file pathname syntax may conform to the standard used by the DOS file system. The pathname describes a hierarchy of directories and a file within the lowest level of directory. Path segments may be delimited by "\". A path prefixed by "\" is relative to the root directory. A path not prefixed by "\", is relative to the current directory. A segment of ".." indicates the parent directory of the current directory.

File directory 203 records file attribute information and a pointer to a first entry in a file index table 204 defining data groups for a file. File directory 203 and the file index table (may also be referred to as "FIT") 204 are generated by flash device 105.

File index table 204 contains an entry for each valid data group within a file with contiguous file offset addresses. Entries for a data group include a file offset address and a physical address.

Every file in a directory points to an entry in FIT 204 (for example, 203B points to 204D). FIT 204 includes an entry for every data group and each entry (for example, 204D) includes an offset value 204A, block value 204B and byte value 204C. The offset value 204A shows offset address within the file corresponding to the start of a data group (for example, 205A). The block value 204B provides the actual physical address of the data block and the byte value 204C points to a byte where the data group begins in flash block 205B.

Figure 3A:
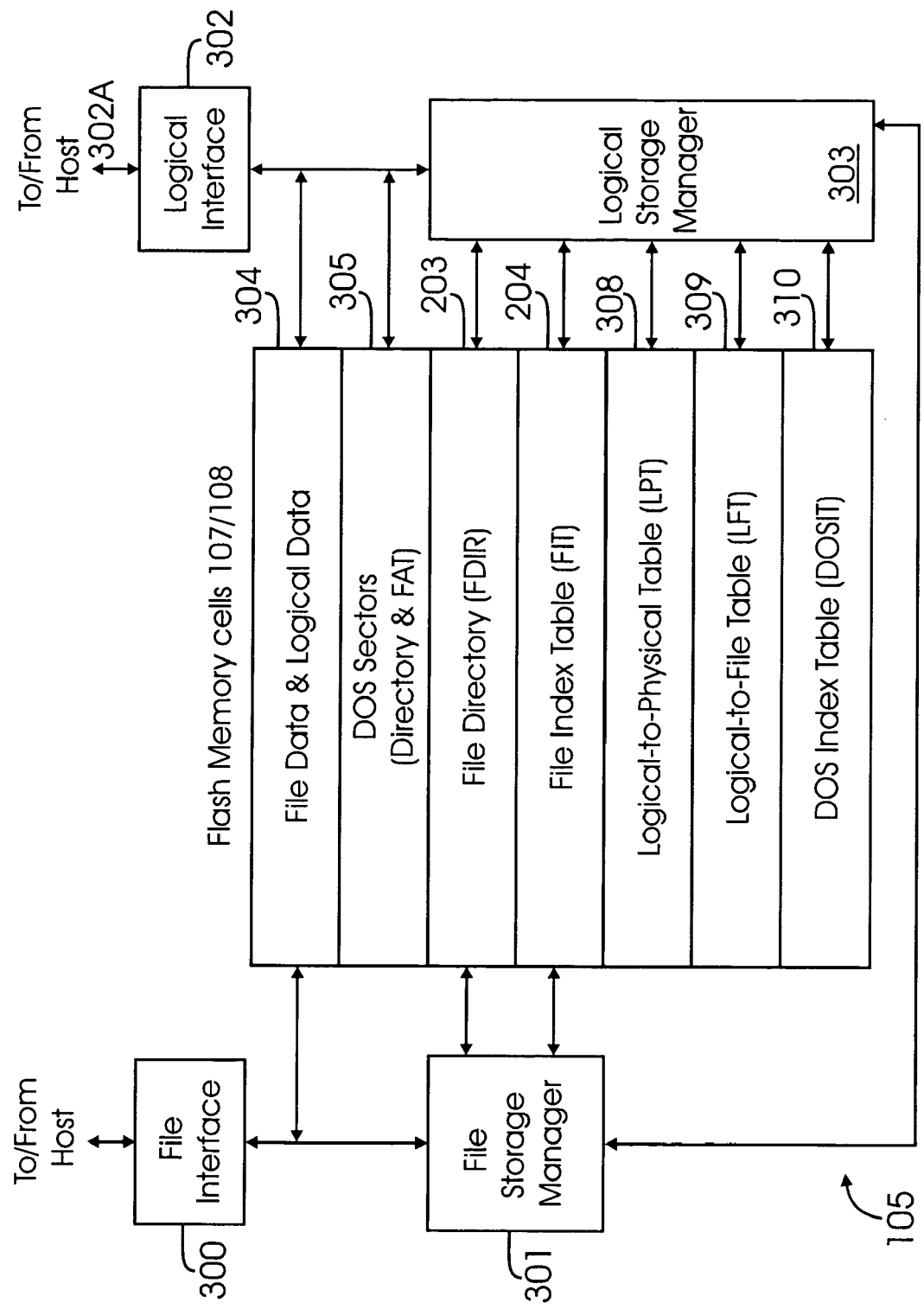
FIG. 3A shows a block diagram of a flash memory device that is accessible via a file interface and a logical interface, according to one aspect of the present invention.
Figure 3B:
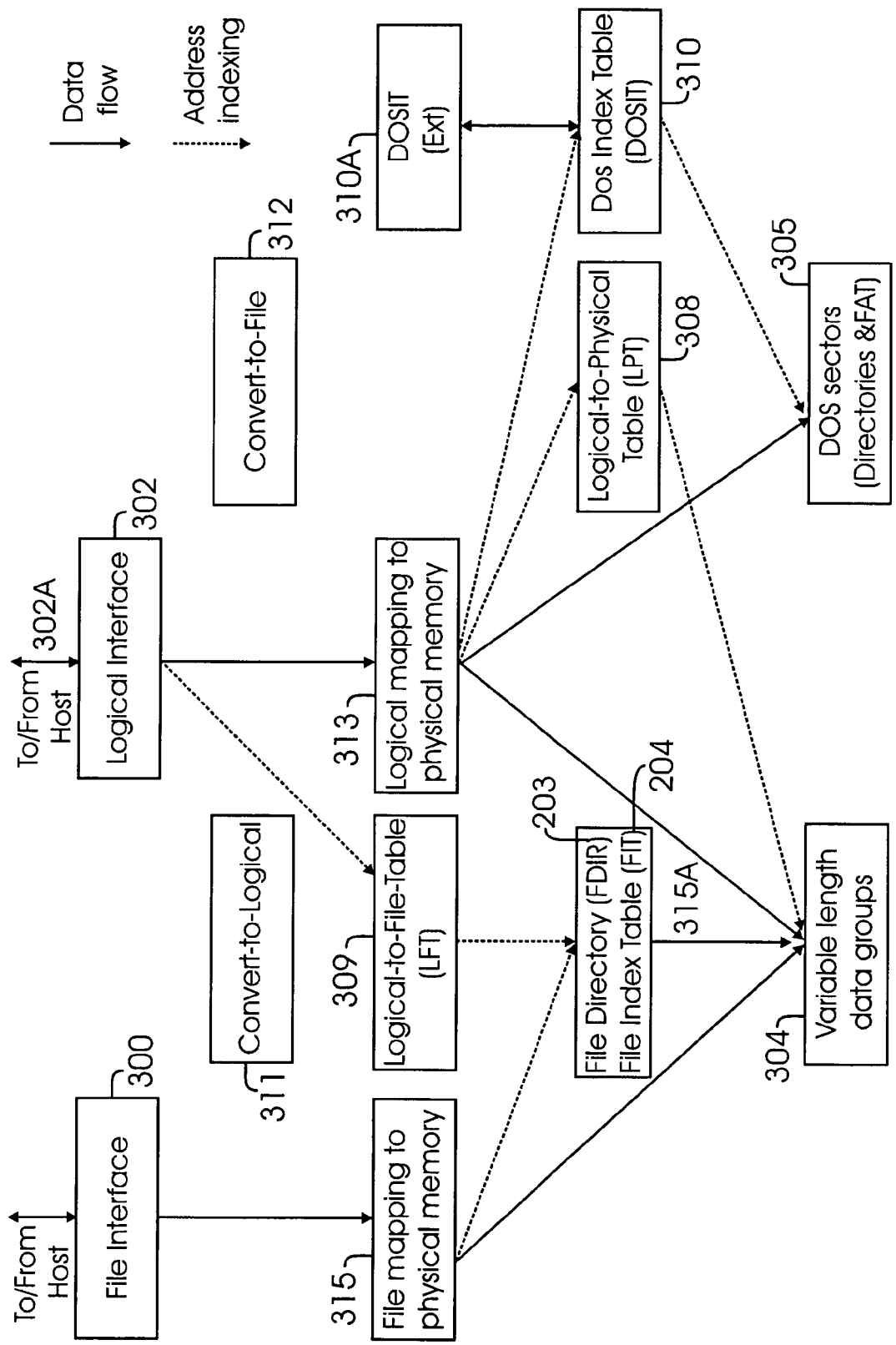
FIG. 3B shows a data flow/address indexing scheme, according to one aspect of the present invention.

Dual Access Mode:

In one aspect, a mass storage system is provided that is accessible via a file interface and/or a logical interface for both read and write operations, i.e. as a DFS device and/or a logical device. FIG. 3A, as described below, shows a top-level functional block diagram of flash device 105 where it can be used both as a DFS device and a logical device. FIG. 3B, as described shows how data and indexing is handled by device 105 operating as a direct data file storage device or logical device.

Figure 3C:
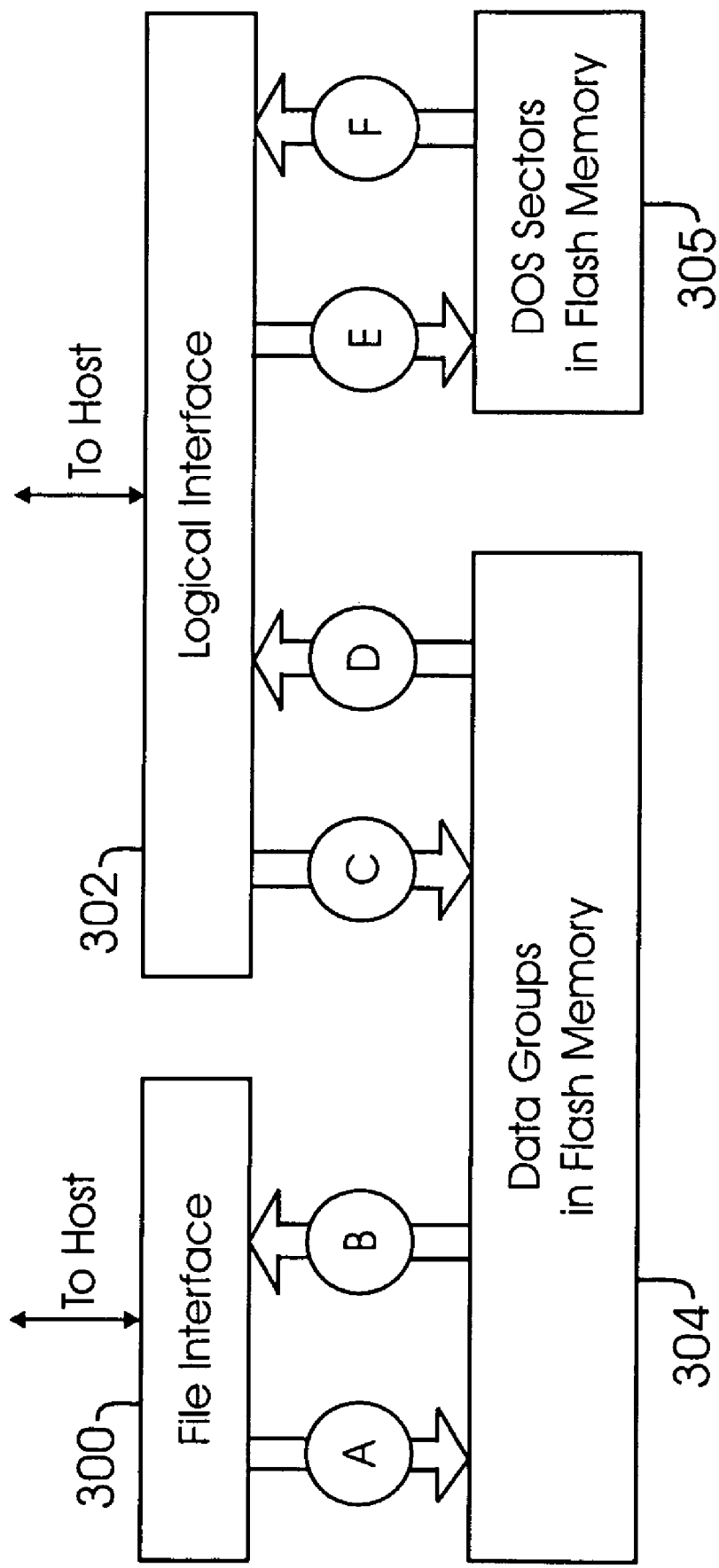
FIG. 3C shows a top-level block diagram of a mass storage device, according to one aspect of the present invention.

FIG. 3C shows a top-level block diagram for device 105 used both as a direct data file storage device and logical storage device. FIG. 3D shows a table of various data accessibility rules for device 105 when it is used as a DFS device and/or as a logical storage device.

As shown in FIG. 3C, when data is written via file interface 300 (shown as (A)), it is immediately accessible for a read operation via file interface 300, (shown as (B)). Similarly, when data is written via logical interface 302 (shown as (C)), and then it is immediately accessible for a read operation via logical interface 302 (shown as (D)). Also, DOS and FAT sector data is accessible immediately after it is written (shown as (E) and (F)).

When data is written via file interface 300 (shown as (A)), it is accessible via logical interface 302 (shown as (D)) after a "convert to logical" operation, as described below. Also, DOS and FAT information relating to data written via file interface 300 (shown as (A)) is accessible after the convert to logical operation.

When data is written via logical interface 302 (shown as (C)), it is accessible via file interface 300 (shown as (B)) after a "convert to file" operation that is described below.

To operate as a DFS device, file interface 300 and a file storage manager 301 are used by device 105. File storage manager 301 interfaces with file directory 203 and FIT 204 maintained in flash memory 107-108, as described above. File interface 300 and file storage manager 301 include the plural modules of a direct data file storage device as shown in FIGS. 1G, 1L and 1M described above and described in more detail in the aforementioned co-pending patent application.

Data received via file interface 300 is mapped to physical memory (shown as 315, FIG. 3B). The data is organized and stored in the order the data is received. File data exists in flash memory 107/108 as variable length data groups (shown as 304, FIG. 3B), where a data group includes contiguous file offset addresses. FIT 204 indexes the location of the data groups as described above and shown as 315A.

Logical interface 302 and a logical store manager module ("LSM") 303 facilitate access to device 105 via a logical path 302A. Logical interface 302 interfaces with a host system to receive host commands/data. LSM 303 interfaces with file directory (shown as FDIR) 203, FIT 204, a logical to physical mapping table ("LPT") 308, a logical to file table ("LFT") 309, a DOS index table ("DOSIT") 310 and file storage manager 301, as described below with respect to FIG. 3B. File data/logical data 304, DOS sectors 305, FDIR 203, FIT 204, LPT 308, LFT 309 and DOSIT 310 are information structures stored in memory cells 107/108.

Referring to FIG. 3B, for data via logical interface 302, the host system provides a logical block address with a sector count. The logical data when received by device 105 may not be associated with any particular file. Device 105 receives the logical data and maps that information to actual physical memory location, shown as 313. The data is stored in memory cells 107/108 (shown as 304).

Figure 4B:
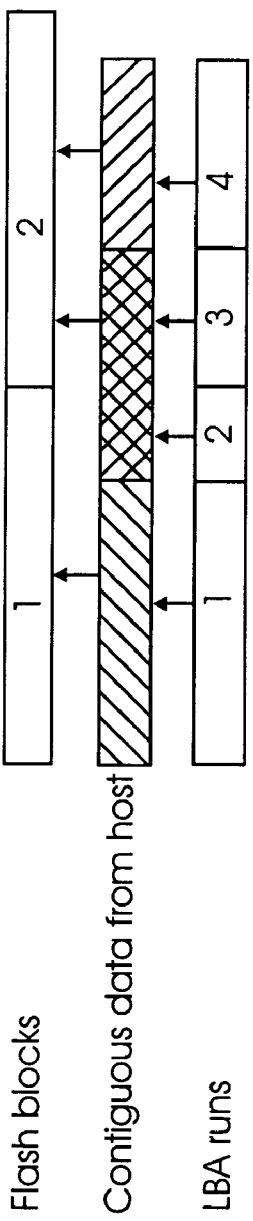
FIG. 4B shows how a logical to physical table is populated, according to one aspect of the present invention.

LPT 308 indexes data that is written via logical interface 302 and is not associated with a file, at a given time. FIG. 4B shows an example of how LPT 308 is built. LPT 308 includes an entry for plural LBA runs, shown as 1-4. Contiguous data received for each LBA runs (1-4) is stored in flash blocks 1 and 2 in flash memory 107/108. Every logical run is handled in the order it is received.

FIG. 4C shows an example of LPT 308 format/fields that are used to index the data received from the host system via logical interface 302. LPT 308 maintains an index of the logical runs as associated with the logical block address for the first sector of the logical run, the length of the logical run, the physical block address and the physical sector address where the data is stored by flash device 105. LPT 308 identifies the physical locations for logical data runs with contiguous addresses.

It is noteworthy that throughout this specification, logical block address (LBA) is intended to identify a sector, while a logical block includes more than one sector and each sector is identified by a logical block address.

When logical address for data received from the host is lower than a corresponding end of a root directory, then data is designated as a directory sector or a FAT sector. This data is then stored by device 105 in a dedicated block 305. DOSIT 310 maintains an index for the stored DOS and FAT sectors.

FIG. 4A shows an example of DOSIT 310 that maintains information for every logical run received from the host system. DOSIT 310 includes the length of each logical run with the associated LBA, the physical block address and the physical cal sector address where the FAT sector is stored.

If the logical address is higher than the end of the root directory, then data is written as a logical update block that is mapped to an equivalent block of logical addresses.

Logical data runs may be updated sequentially or chaotically and LPT 308 can handle both situations, as described below, hence separate indexing mechanisms are not needed. This is possible because an LPT 308 entry has the same format as a FIT 204 entry, except that the LPT 308 entry relates to a logical block address rather than file offset address. Entries in LPT 308 define logical runs where the logical block addresses for plural sectors are sequential. However, multiple LPT 308 entries may be used to define a logical block. Address runs in a logical block may be out of order (i.e. chaotic) and LPT 308 can index the out of order logical block addresses.

Logical update blocks may exist concurrently and hence may need garbage collection operations. During garbage collection, data groups are copied from other flash blocks to complete a block. If the copied data group is indexed by FIT 204 and then FIT 204 entry is modified to reflect the new location. If a copied data group is indexed by LPT 308, then the copy operation itself is a part of a logical block consolidation.

As stated earlier, data that is indexed by FIT 204 can also be accessed via the logical interface 302. Logical to File table ("LFT") 309 maps a LBA run to a file indexed by FIT 204.

Figure 4D:
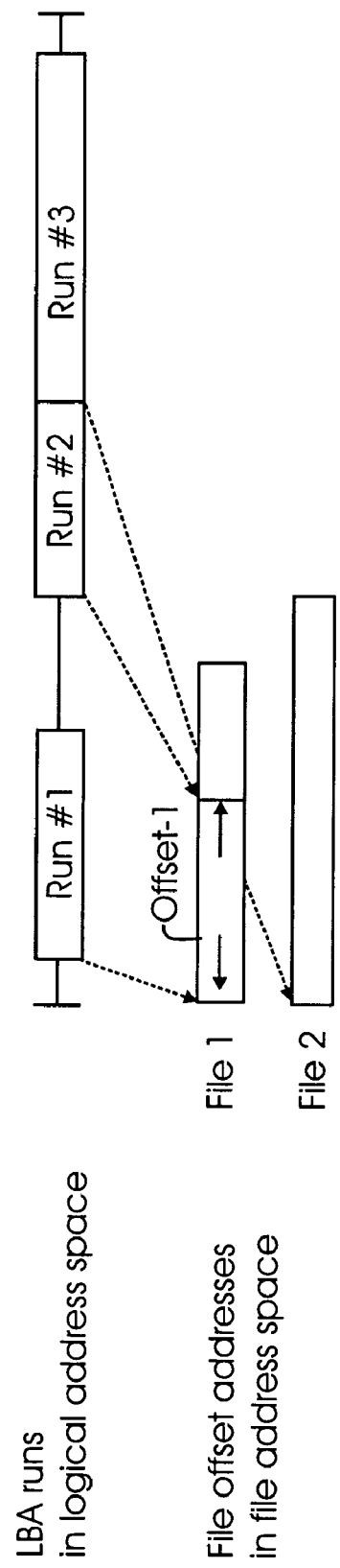
FIG. 4D illustrates how a logical to file table is populated, according to one aspect of the present invention.

FIG. 4D illustrates how individual logical runs are associated with file offset values to populate LFT 309. In FIG. 4D, the logical run (shown as Run 1) is associated with File 1, having an offset value shown as offset 1. Logical run 2 is also associated with File 1. Logical Run 3 is associated with 2.

FIG. 4E shows an example of LFT 309 layout and the entries used to associate each logical run with a file offset and a file identifier value (for example, a file handle). For each LBA run in the logical address, LFT 309 identifies a file identifier and a file offset address.

LFT 309 also allows a host system to access logical data via file interface 300. LFT 309 indexes logical data during the convert to file operation, described below with respect to FIG. 8.

Figure 5I:
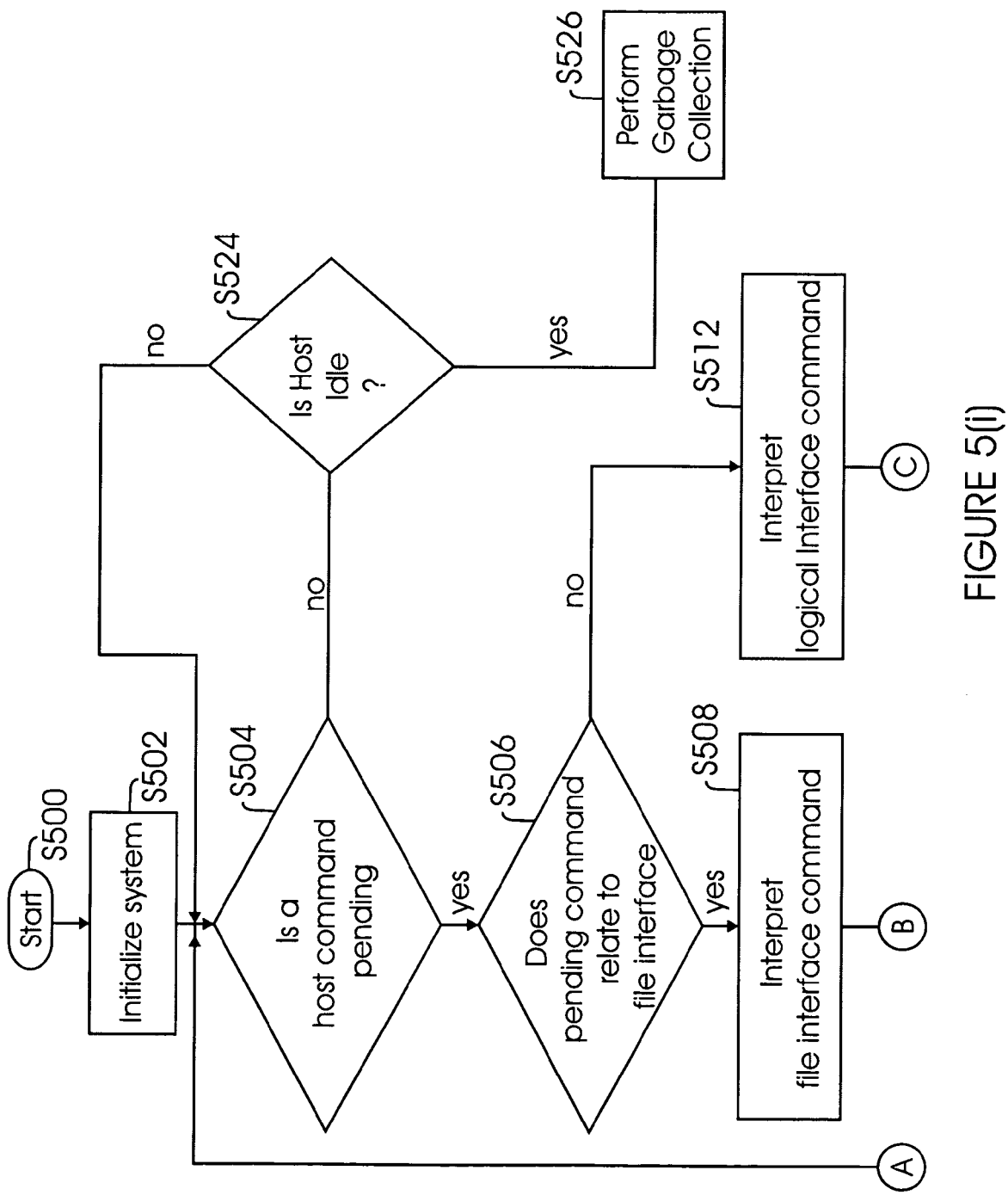
FIG. 5 shows an overall flow diagram for the mass storage device, according to one aspect of the present invention.
Figure 5:
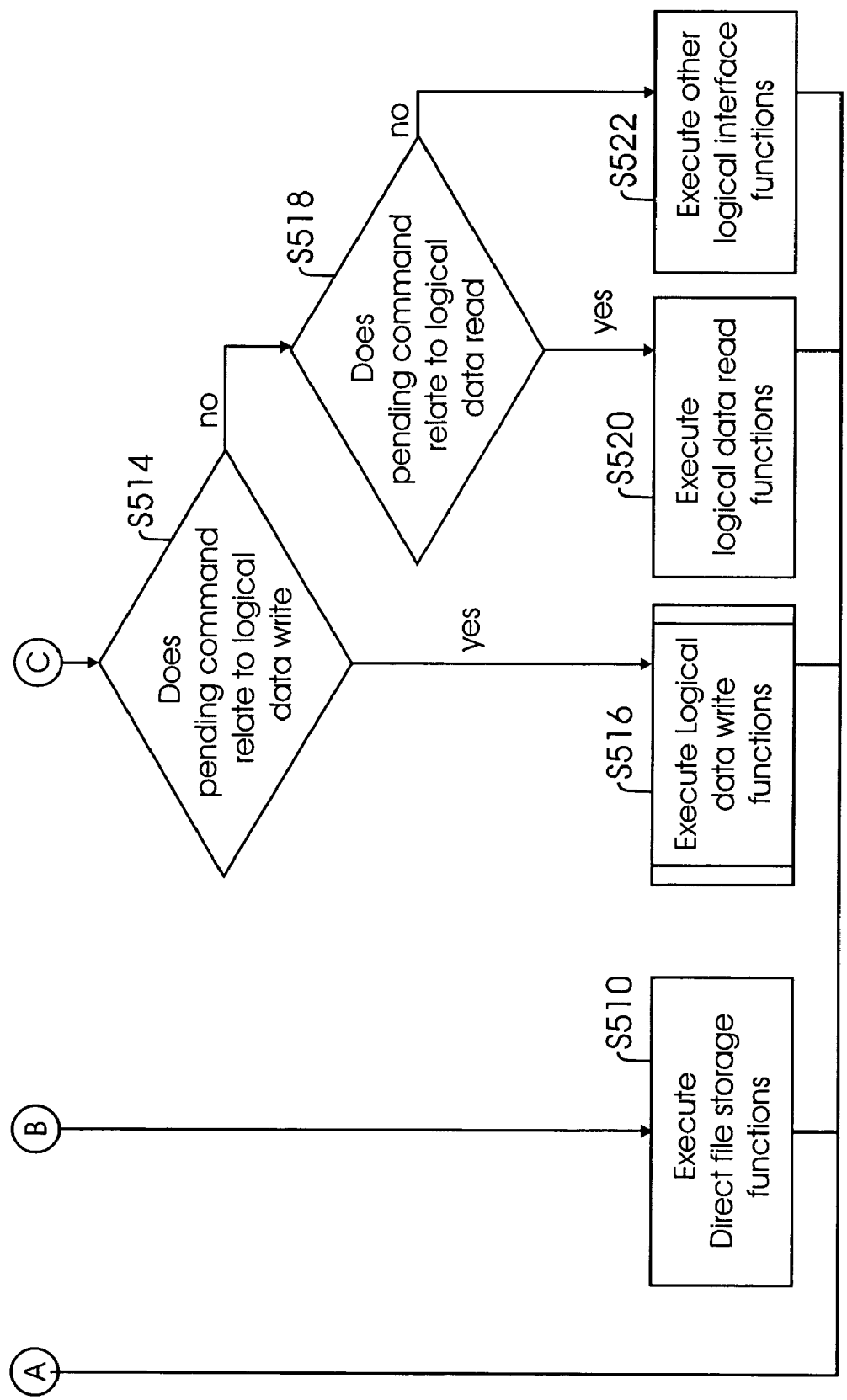

Overall Device 105 Process Flow:

FIG. 5 shows an overall flow diagram for flash device 105. The process starts in step S500 and in step S502, flash device 105 is initialized, which includes initializing the memory controller 106, and executing boot code so that firmware is loaded into memory 110.

In step S504, memory system 105 looks for a command from the host system.

If a host command is pending, then in step S506, memory controller 106 determines if the command is related to the file interface 300. If the command is related to the file interface 300, then in step S508 memory controller 106 interprets the command and in step S510, executes direct data file storage functions. The aforementioned co-pending application provides list of various commands that may be related to direct data file storage functions, including a Read, Write, Insert, Update, Remove, Delete and Erase commands.

If the host command is not related to file interface 300 in S506, then in step S512, memory controller 106 interprets the command as a logical interface command received via logical interface 302.

In step S514, memory controller 106 determines if the command is for a logical write operation. If the command is for a logical write operation, then in step S516, the logical write operation (described below with respect to FIG. 6) is executed.

If the command is not for a logical write operation, then in Step S518, controller 106 determines if the pending command relates to a logical data read operation.

If the command is for a data read operation, then in step S520, the data read operation is executed. Details of the read operation are provided in the patent application filed herewith, Ser. No. 11/196,168, Filed on Aug. 3, 2005, and entitled "Method And System For Dual Mode Access For Storage Devices".

If the command is not related to the logical read operation, then in step S522, memory controller 106 determines if the command is related to any other function. Examples of other logical interface functions include reading device parameters ("Identify Drive" command), changing device state ("Idle" and "Standby" commands) and others.

Returning to step S504, if a command is not pending, then in step S524, memory controller 106 determines if the host interfaces, i.e., logical and file interface are idle. If they are idle, then in step S526, garbage collection is performed. Garbage collection may also be performed if an Idle command is received at step S504. If the host interfaces are not idle, then the process returns to step S504 and memory again looks for a pending host command.

Figure 6I:
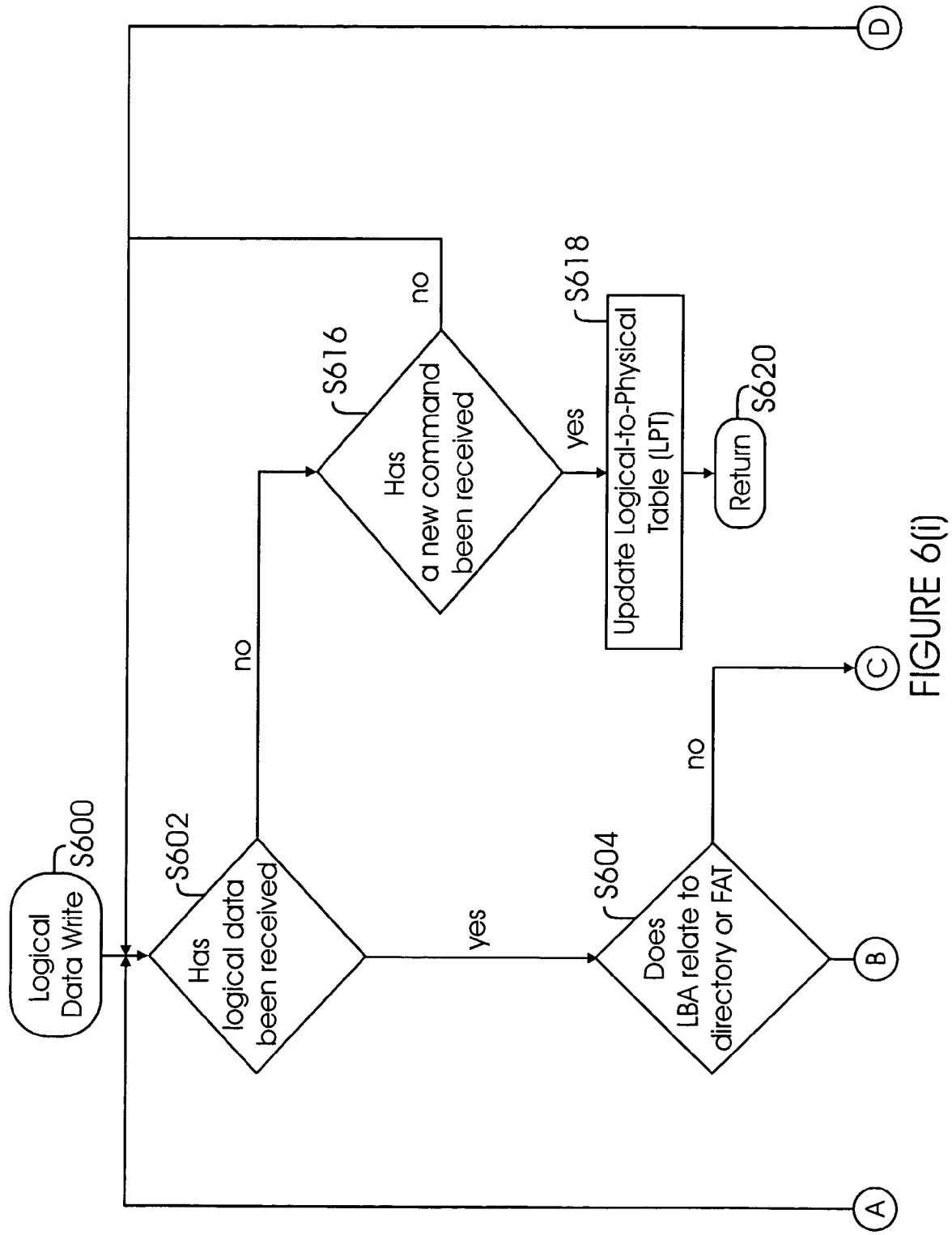
FIG. 6 shows a flow diagram for a logical write process, according to one aspect of the present invention.
Figure 6:
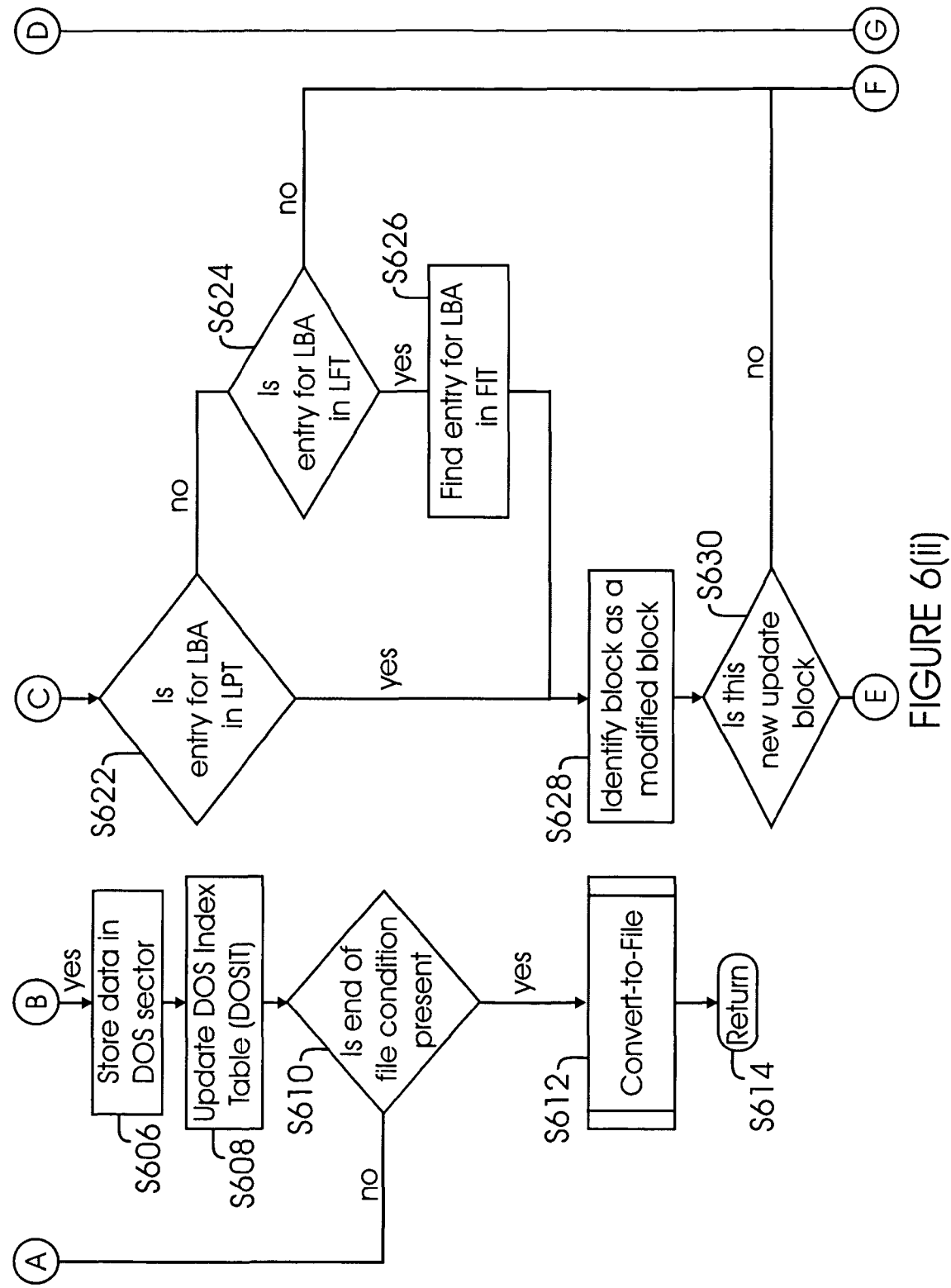

Write Operation:

FIG. 6 shows a flow diagram of process steps for a logical data write operation (s516, FIG. 5) in flash device 105 that also functions as a direct data file storage device, in one aspect of the present invention. The process starts in step S600 and in step S602, controller 106 determines if logical data has been received via logical interface 302. If logical data has not been received, then in step S616, controller 106 determines if a new command has been received. If a new command (for example, write, read or any other command) has been received from the host system, then in step S618, LPT 308 is updated. In step S620, the process returns to step S504 in FIG. 5. If a new command is not received in step S616, then the process reverts back to step S602.

If logical data was received in step S602, then in step S604, controller 106 determines if the LBA is related to a directory or DOS sector. If the logical address of the data is lower than the "end" of root directory, then it is designated as a directory or FAT sector. If logical data is related to a DOS sector, then the logical data is stored in a DOS sector 305 in step S606, and in step S608, the DOSIT 310 is updated.

In step S610, controller 106 determines if an "end of file" condition is present. If the condition is present, then in step S612, the process moves to a "convert to file" operation described below with respect to FIG. 7 and in step S614, the process returns to step S504, FIG. 5. If in step S610, the end of file condition is not present, then the process reverts back to step S602.

If in step S604, the logical data is not related to a directory or FAT sector, then in step S622, controller 106 determines if there is an entry for the LBA in LPT 308. If there is an entry, then in step S628 the operation is identified as an update operation and the block is identified as a modified block and the process moves to step S630.

If in step S622, an entry for the LBA in not present in LPT 308, then in step S624, controller 106 determines if an entry is present in LFT 309. If the entry is present, then in step S626, memory controller 106 finds the entry in FIT 204, which provides a physical address associated with the LBA. If an entry is not found in step S624, then the process moves to step S638, described below.

In step S630, controller 106 determines if the block (from S628) is a new update block. If yes, then in step S632, controller 106 determines if the oldest modified block fully obsolete. If yes, then the oldest modified block is placed in the obsolete block queue for subsequent garbage collection, as described in the co-pending Direct Data File Storage Applications.

If in step S632, the oldest modified block is not fully obsolete, then in step S636, the block is placed in a common block queue for garbage collection that is described in the aforementioned patent application (Reference to SDK0569).

In step S638, controller 106 determines if the address for the LBA run is contiguous. If yes, then the data is stored in step S642. If the address is not contiguous, then LPT 308 is updated in S640 and the data is stored in step S642. The process then reverts back to step S602.

Convert to File Process Flow:

As logical data is received via logical interface 302, LPT 308 entries are created. As stated earlier, when a host sends data via logical interface 302, the data is not associated with a file. After one or more logical data runs, entries in LPT 308 are indexed so that the logical data is accessible via file interface 300. This occurs during the convert to file operation. The convert to file operation 312, as shown in FIG. 3A and described below with respect to FIG. 7, converts logical to physical indexing information in LPT 308 to file directory 203, FIT 204 and LFT 309, so that logical data can be indexed as a file and becomes accessible via file interface 300.

The convert to file operation is initiated by an "end of file" condition in a sequence received at logical interface 302. The end of file condition is generated by a host system after the host completes writing data. The end of file condition is a characteristic sequence of directory and FAT write operations. It is noteworthy that the "convert to file" operation may also be initiated by a specific host command at the logical interface.

Figure 7:
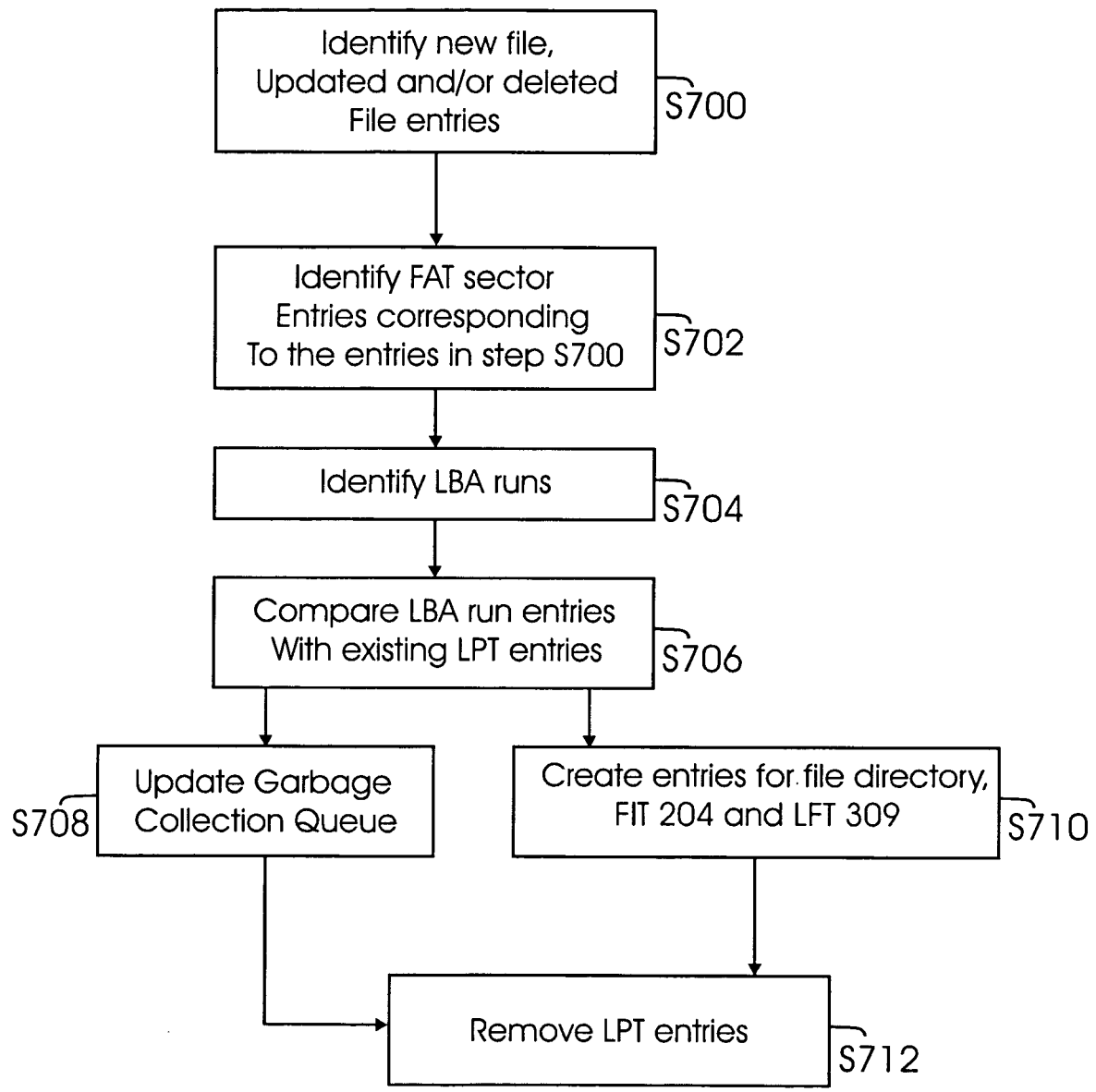
FIG. 7 shows a flow diagram for the convert to file process, according to one aspect of the present invention.

Turning in detail to FIG. 7, the process starts in step S700. In step S700, controller 106 identifies the logical data with new file entries, updated and/or deleted files. During step S700, controller 106 determines if the host system has written new data, modified existing data or deleted any information. The content of a directory sector written by a host system is compared to a previous version and this allows controller 106 to identify entries for any new file, existing file that has been updated and any file that has been deleted.

Figure 4F:
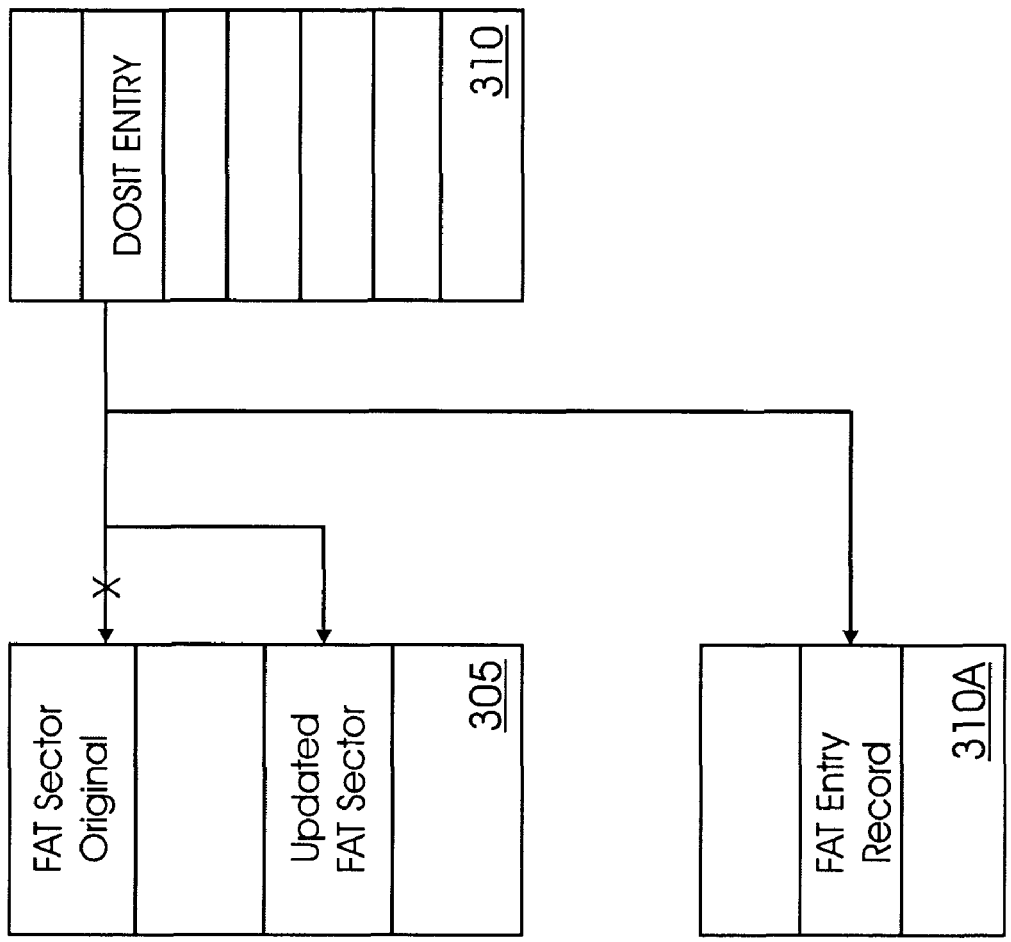
FIG. 4F illustrates how records of updated FAT entries are maintained, according to one aspect of the present invention.

In step S702, controller 106 identifies FAT entries related to the entries that are identified in step S700. When a host writes a FAT sector, DOSIT 310 maintains a record of the FAT sectors as related to the LBA run. An extension table (DOSIT (ext)) 310A maintains a record of the updated FAT entries. This is shown in FIG. 4F, where an original FAT sector entry is stored in DOSIT 310. After the FAT sector is updated, table 310A stores the previous entry value and the updated entry value. The DOSIT 310 maintains all the current and updated entries.

In step S704, the LBA runs for data that has been written, updated or deleted are identified.

In step S706, LPT 308 is scanned to determine if data for the LBA runs already exists.

In step S708, after data is identified to be new or modified, entries are created in file directory 203, FIT 204 and LFT 309.

In step 710, garbage collection queues are updated. Garbage collection needs are minimized, if the host has not repeated data. Garbage collection is performed if data for an LBA run has been written more than once. Garbage collection also deletes logical data that is not associated with any file. Garbage collection is described in the co-pending Direct Data File Storage Applications.

In step S712, entries for data runs identified in step S704 are removed from LPT 308.

Convert to Logical Process:

In one aspect of the present invention, data written via file interface 300 is accessible via logical interface 302. The convert to logical operation (shown as 311, FIG. 3B) is performed to make that data accessible. The "convert to logical" operation creates FAT and directory entries in DOS sectors 305 and in LFT 309, so that data that is written via file interface 300 can be accessed via logical interface 302. This operation may be initiated after a "Close" command is received via file interface 300. The Close command signifies that a file write operation via file interface 300 is complete. This operation may also be initiated by a specific command (for example, "convert to logical") from the host. The specific command will allow a host that has written via file interface 300 to control file access via logical interface 302.

Figure 8:
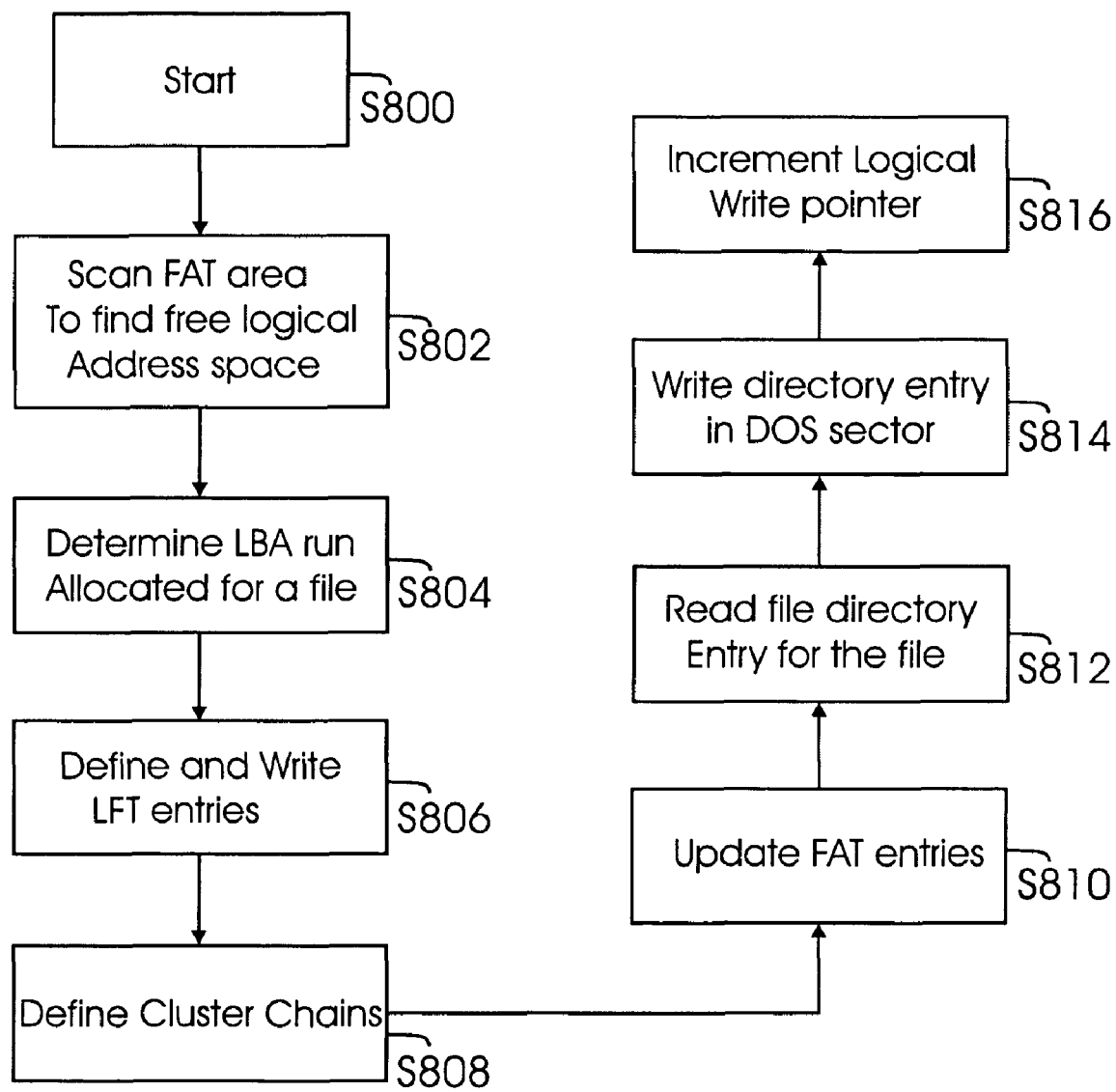
FIG. 8 shows a flow diagram for a convert to logical process, according to one aspect of the present invention.

FIG. 8 shows a process flow diagram for performing the convert to logical operation. In step S800, the convert to logical operation begins. The operation starts after a "close" command or a specific command to start the convert to logical operation is received by controller 106.

In step S802, FIT 204 is scanned to determine the length of the file that will be made accessible via logical interface 302. In step S804, DOS sectors 305 are scanned to find sufficient logical address space that will be allocated to a particular file (or batch of files) for which the convert to logical operation is being performed.

In step S806, a LBA run is allocated (or associated) for the file. In step S808, LFT 309 entries are written. The entries associate a LBA run, LBA length with a file identifier having a file offset value. The file identifier and offset information is obtained from FIT 204.

In step S810, controller 106 defines cluster chains for the file.

In step S812, the FAT entries in DOS sectors 305 are updated and in step S814, the file directory entries for the file are read. In step S816, directory entries are written in DOS sector 305. In step S818, the logical write pointer in the FAT is incremented so that future convert to logical operations can be tracked and accommodated.

It is noteworthy that controller 106 performs the foregoing convert to logical operation after a file is written via file interface 300.

In one aspect of the present invention, data written via a file interface is accessible via a logical interface. Hence, a flash device can operate with both a legacy host that does not support a file interface and a host system that supports a file interface.

In another aspect of the present invention, data written via a logical interface is accessible via a file interface. Hence, the flash device can be used easily with legacy host system and advanced host systems that support the direct data file storage format.

Real Time Dual Interface Access:

In one aspect of the present invention, a flash device is provided that can be accessed via a logical interface or a file interface in real time, regardless of which interface is used to write data to the flash device. The term real-time in this context means that there are more than one FAT/directory updates instead of a single FAT/Directory update at the end of a file write operation. In one aspect of the present invention, there are one or more than one FAT/directory updates.

If a host system writes data via file interface 301, then controller 106 allocates available LBA space and updates FAT entries in memory cells 107/108. The FAT update may be performed substantially in real-time or after a file write operation. This allows data written via file interface 301 to be immediately available via logical interface 302.

The LBA allocation and FAT update is performed by an embedded system (907, FIG. 9A) with an output that is specific to the file storage back-end system. In another aspect, the embedded file system output is similar to the logical interface used by a host system. Hence, the embedded file system can be a software module that is similar to the host's LBA based file system.

When file data is written via a logical interface 302, then controller 106 identifies the data run as a file. This allows the data run to be accessible via the file interface 301 even if the file write operation has not been completed by the file system (i.e. FAT and directory write operations).

Any data written via file interface or via logical interface (whether identified as a file by the host or not) is uniquely identified by a LBA and a unique file identifier. This allows data to be accessible from both the interfaces.

Figure 9A:
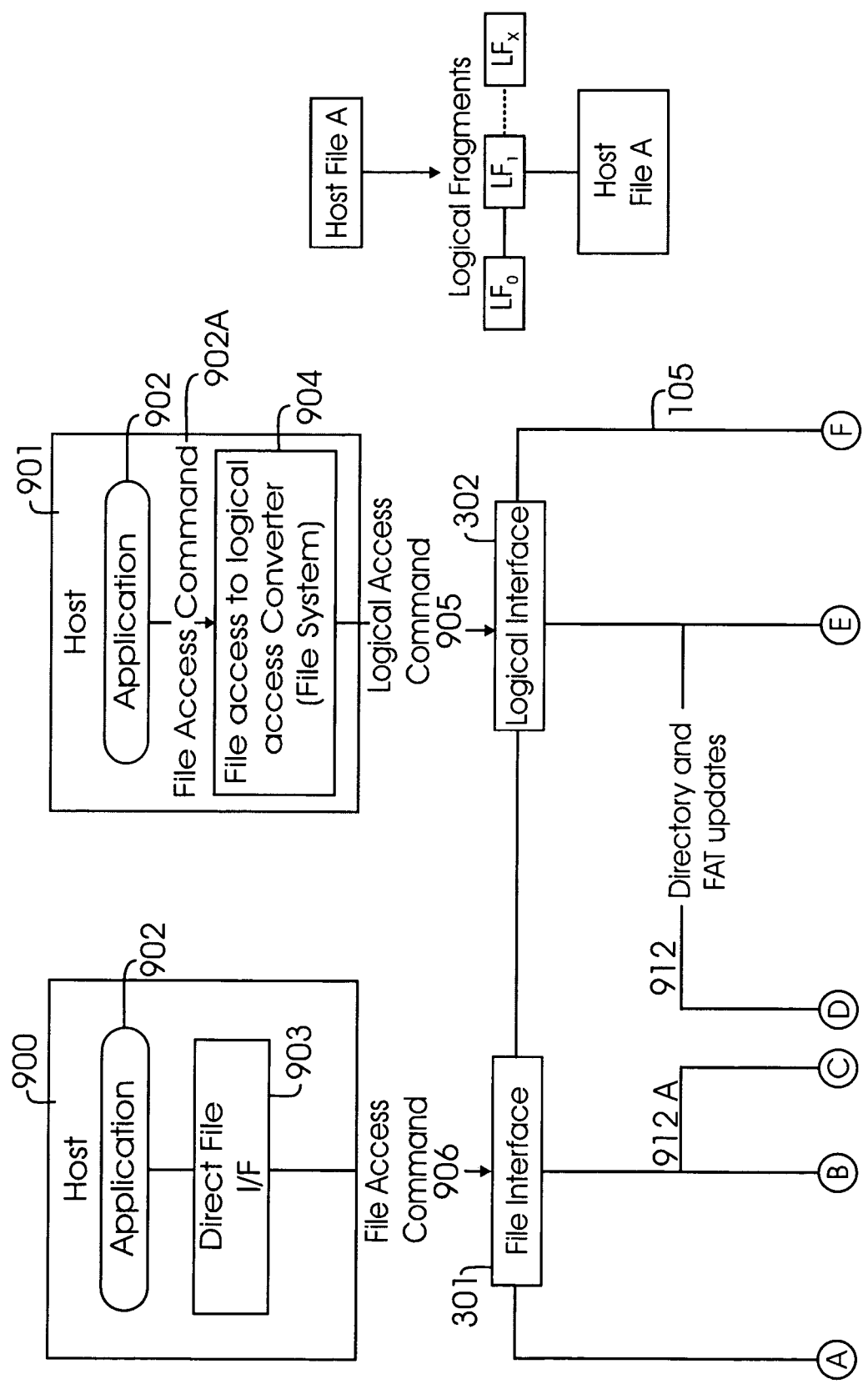
FIGS. 9A and 9B show block diagrams of a file access system, according to yet another aspect of the present invention.
Figure 9B:
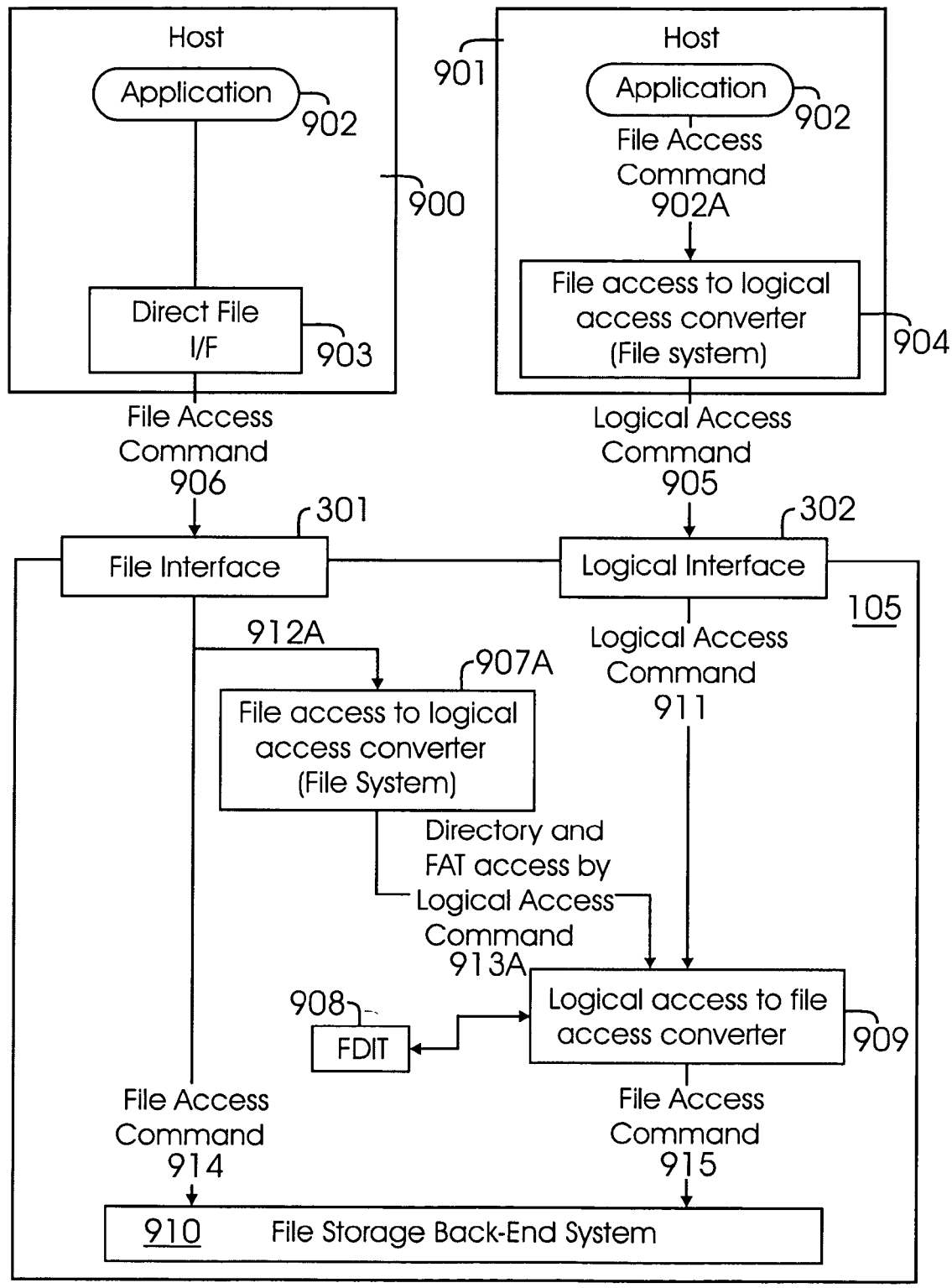

FIGS. 9A and 9B provide block diagrams of yet other aspects of the present invention. A file dual index table ("FDIT") 308 is maintained in flash memory (107/108). FDIT 308 maintains an entry for every file name with an offset value and a corresponding LBA (allocated by memory controller 106). This allows access to files written via file interface 301 and/or logical interface 302, as described below.

Turning in detail to FIG. 9A, host 900 uses a direct data file interface 903 and host 901 uses a standard file system 904 to write data to flash 105 via file interface 301 and logical interface 302, respectively.

In host 900, direct data file interface 903 interfaces with application 902 and sends file access commands 906 to flash 105. The file access commands are received by file interface 301 and processed by controller 106. Files from host system 900 are shown as HFa, HFb . . . HFx.

To write data in flash device 105 via file interface 301, host 900 sends a file name and an offset value (906) to flash 105. Data is then stored by the file storage back-end system 910 as variable data groups (shown as HFa, HFb . . . HFx). When data is received via file interface 301, memory controller 106 places a call to the file access to logical converter 907 (also referred to as "converter 907") to register the received file (for example, HFa) with FDIT 908.

Memory controller 106 analyzes FAT/directory area (shown as 305, FIG. 3A) and allocates logical space to the file received via the file interface 301. Converter 907 then updates FDIT 308 so that the file written via file interface 301 can also be accessed via logical interface 302.

Converter 907, after updating FDIT 908, generates file access commands (913, FIG. 9A) that allow access to directory and FAT area. Alternatively, converter 907A (shown in FIG. 9B) generates logical access command 913A that is then sent to converter 909. Converter 909 takes the logical commands 913A and converts them into file access command 915 that is sent to the file storage back-end system 910. One advantage of the second approach is that file system 904 and 907A are identical and hence easier to implement.

In host 901, file system 904 interfaces with application 902. File system 904 receives file access commands (902A) from application 902 and then converts the file access commands 902A into logical access command 905. The logical access command 905 are received by logical interface 302 and then processed by memory controller 106. An example is shown where Host File A is received by file system 904 that sends logical fragments (shown as LF0, LF1 . . . LFx) to logical interface 302 and then saved as Host File A in memory cells 107/108, as described below in detail.

To write data via logical interface 302, application 902 sends file access commands 902A to file system 904. File system 904 analyzes FAT information to see if free logical sectors are available and can be allocated to a particular file. Host 901 typically only knows its logical address space and the logical addresses that it has allocated to its various files. If free sectors/clusters are available, then logical space is allocated. Host 901 then sends logical fragments (shown as LF0, LF1 . . . LFx)/(logical access command 905) to flash 105.

After flash 105 receives logical command 905, memory controller 106 updates directory and FAT information. The updated FAT and directory information 912 is sent to converter 907. In another aspect of the present invention, converter 907 does not need to be updated every time, as it can instead access FAT/directory stored in non-volatile memory 107/108 directly itself when it is necessary to do a conversion is needed.

Logical access command 911 is also sent to converter 909 that generates file access command 915 to store data in memory cells 107/108.

Each logical data run is assigned an internal file name (i.e. internal to the flash system 105) by memory controller 106 (using converter 909 interfacing with FDIT 908). In one aspect, more than one internal file name is used to identify and store the logical data runs. The internal file name can be based on various factors, for example, StartLBA_Length and/or the LBA. The StartLBA_Length is based on the length of a logical data run and the start of a LBA, while the second file identifier ("ID") is based on the actual LBA.

As host 901 continues to send logical data runs, memory controller 106 keeps saving the logical data runs as individual internal files. The internal files are all merged into a single file when host 901 sends a host file name to flash 105. Memory controller 106 associates plural data runs with the host file name. Memory controller 106 retains the second file ID, i.e., the LBAs for the plural data runs.

Once the host file name is associated with the various data runs, converter 909 updates FDIT 908 so that the LBA, logical sector address is associated with the host file name and file offset value. File access command 915 is sent to the file storage back-end system 910 that stores the data received via logical interface 302 in memory cells 107/108 (see FIG. 3A). This allows a file written via logical interface to be accessible via file interface 301.

Figure 10B:
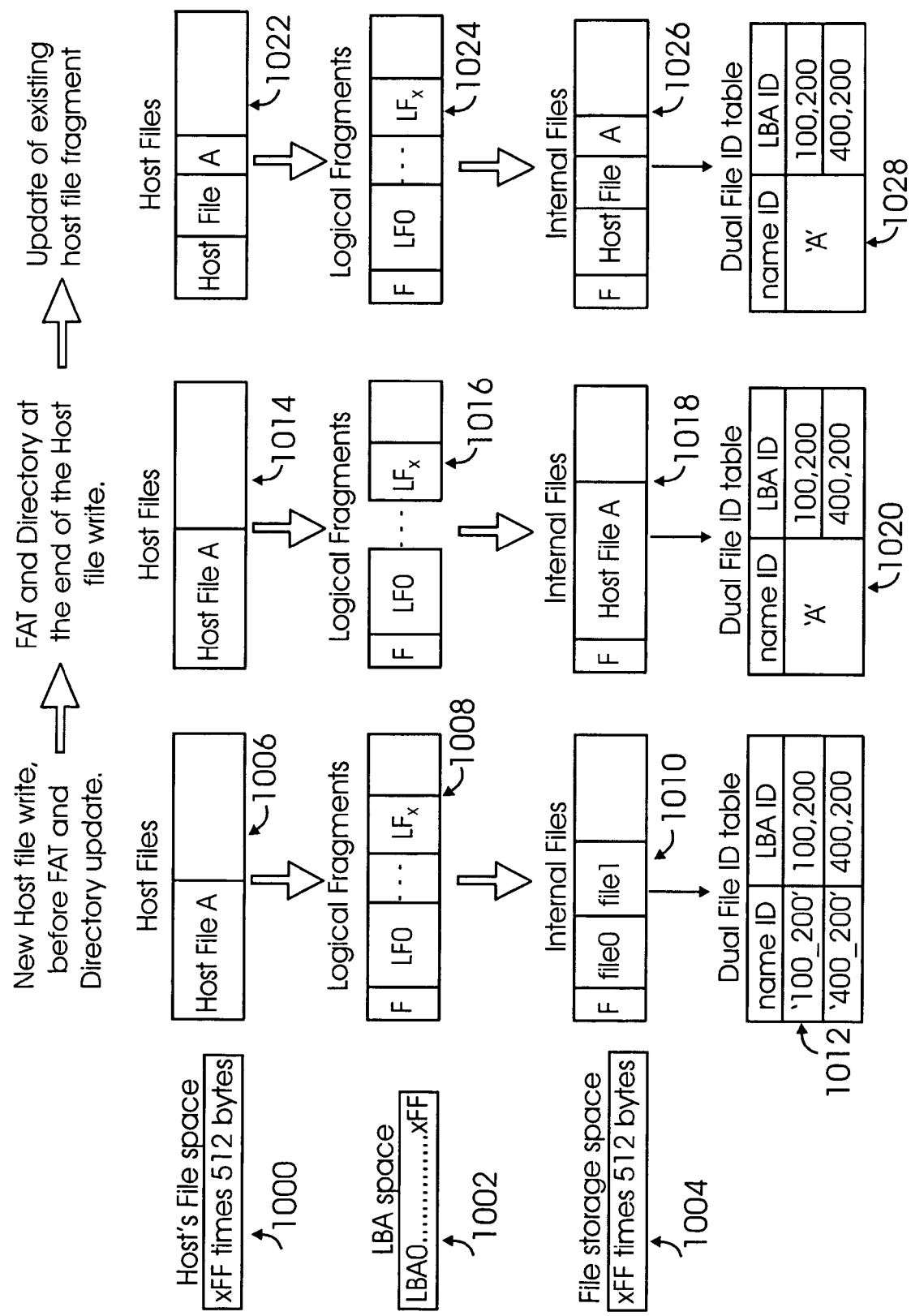
FIG. 10B shows an example of a file write process using internal file names, according to one aspect of the present invention.

FIG. 10B illustrates the file write process via logical interface 302 and the use of the internal files described above. Host 901's file space 1000 is shown as multiples of 512 bytes (minimum sector size, LBA space is shown as 1002 and data as stored is shown as 1004. It is noteworthy that the present invention is not limited to any particular sector size or data unit size.

When the host writes a new file before FAT/directory update, file system 904 allocates LBAs and generates logical commands (905) to write the file data (shown as 1006 and 1008 (LF0 . . . . LFx). File storage system 105 then organizes the logical fragments into internal files. The internal files are shown as file 0, file 1 and so forth (1010). A dual file ID table 1012 (same as FDIT 908) is maintained. The example in FIG. 10B shows the StartLBA_Length (100_200) and the LBA ID (100, 200) as the file identifiers.

After all the logical fragments are stored, file system 904 updates FAT and directory information through logical commands (shown as Host File A (1014). Now the host file (Host File A) is associated with the logical fragments (shown as 1016).

File storage system 105 then updates FAT/directory files and merges all the internal files and associates them to the host file ("A")(shown as 1018).

The updated dual file ID table (1020) saves the host file name "A" with the associated LBA ID (in this example, 100, 200 and 400, 200).

In order to update an existing host file (for example, host file "A"), host file system 904 identifies the LBAs for the fragment (shown as 1022) and generates the logical commands (shown as 1024). In this example, the LBA is 400,100 for the update process.

File storage system 105 then identifies the fragments offset in the existing stored file "A" (200*sector size) and then writes the new fragment (shown as 1026). The file identifiers stay the same (1028) but the physical location of the file data, especially the new fragment may change.

It is noteworthy that the dual file ID tables shown in FIG. 10B are a part of FDIT 908.

FDIT 908 is stored in flash device 105 and is updated/ maintained real time (i.e. more than once, instead of being updated only after a file write operation) by converter 907/ 907A and converter 909. This keeps both the file interface 301 and logical interface 302 synchronized.

FDIT 908 fields are shown in FIG. 10A and include the file name, file offset, logical sector address, LBA and logical data run number. For data written via file interface 301, LBAs are assigned and stored in FDIT 908. Data written via logical interface is assigned the host file name and stored with an offset value. Hence data written via either interface can be accessed.

Figure 11:
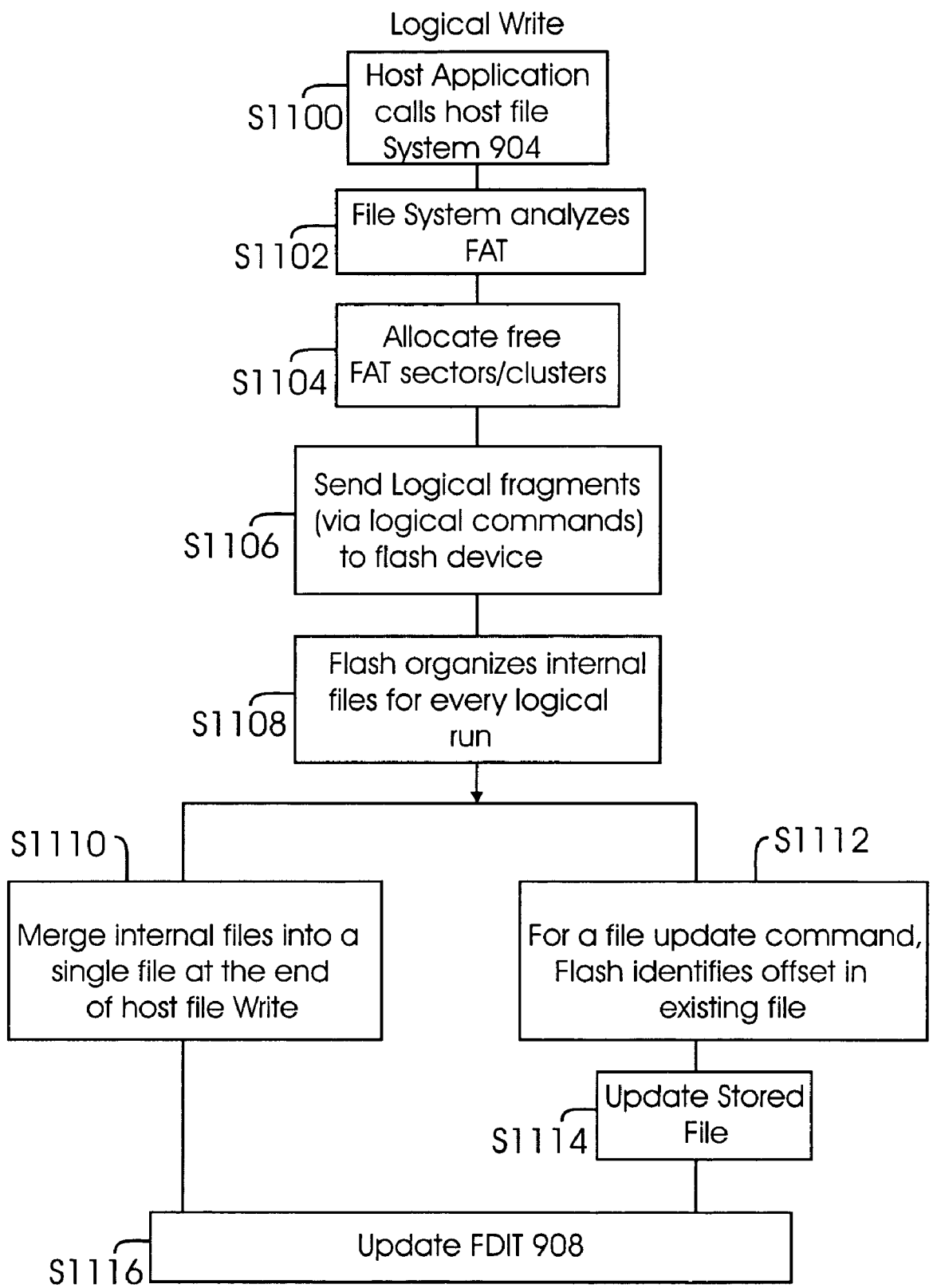
FIGS. 11 and 12 show process flow diagrams for a write process using the system of FIGS. 9A and 9B, according to one aspect of the present invention.

Logical Write Process Flow:

FIG. 11 shows the overall process flow diagram for a write operation via logical interface 301 with respect to the system disclosed in FIGS. 9A and 9B. The process starts in step S1100, where host application 902 sends file access commands 902A to file system 904 to write data.

In step S1102, file system 904 analyzes FAT/directory information for free logical sector/cluster space. In step S1104, file system 904 allocates free cluster/logical sectors and generates logical commands to write the file data. In step S1106, file system sends logical fragments to flash 105 (1008, FIG. 10B). Logical fragments are received by flash 105 via logical interface 302.

In step S1108, memory controller 106 updates FAT/Directory and organizes the logical fragments into internal files. An example of how the internal files are named and stored is provided above with respect to FIG. 10B.

In step S1110, the internal files created during step S1108 are merged into a single internal file, if a host file name (for example, A, 1014, FIG. 10B) is available after host 901 writes to the FAT area creating a new chain of clusters for a new host file. If the host file itself is logically fragmented, it can be de-fragmented during initialization or when it is being accessed via file interface 301.

Host 901 does not always create new chain of clusters for a host file and instead performs the following:

If the host 901 writes to the FAT area so that it allocates clusters that were previously marked as unused, then the corresponding range of LBAs are not used for any write operations via file interface 301.

If the host 901 writes to the FAT area and deletes some clusters that were previously marked as used, then the corresponding range of LBAs are made available for a write operation. The internal files associated with the LBAs can be deleted during garbage collection.

If host 901 is updating an existing file, then controller 106 identifies the file offset in an existing file and in step S1114, the new fragments are stored. The file ID stays the same but the physical location of the file data may change, especially for the new data fragment.

In step S1116, FDIT 908 is updated so that the host file's LBA is associated with a file name and offset and hence, is accessible via file interface 301.

Figure 12:
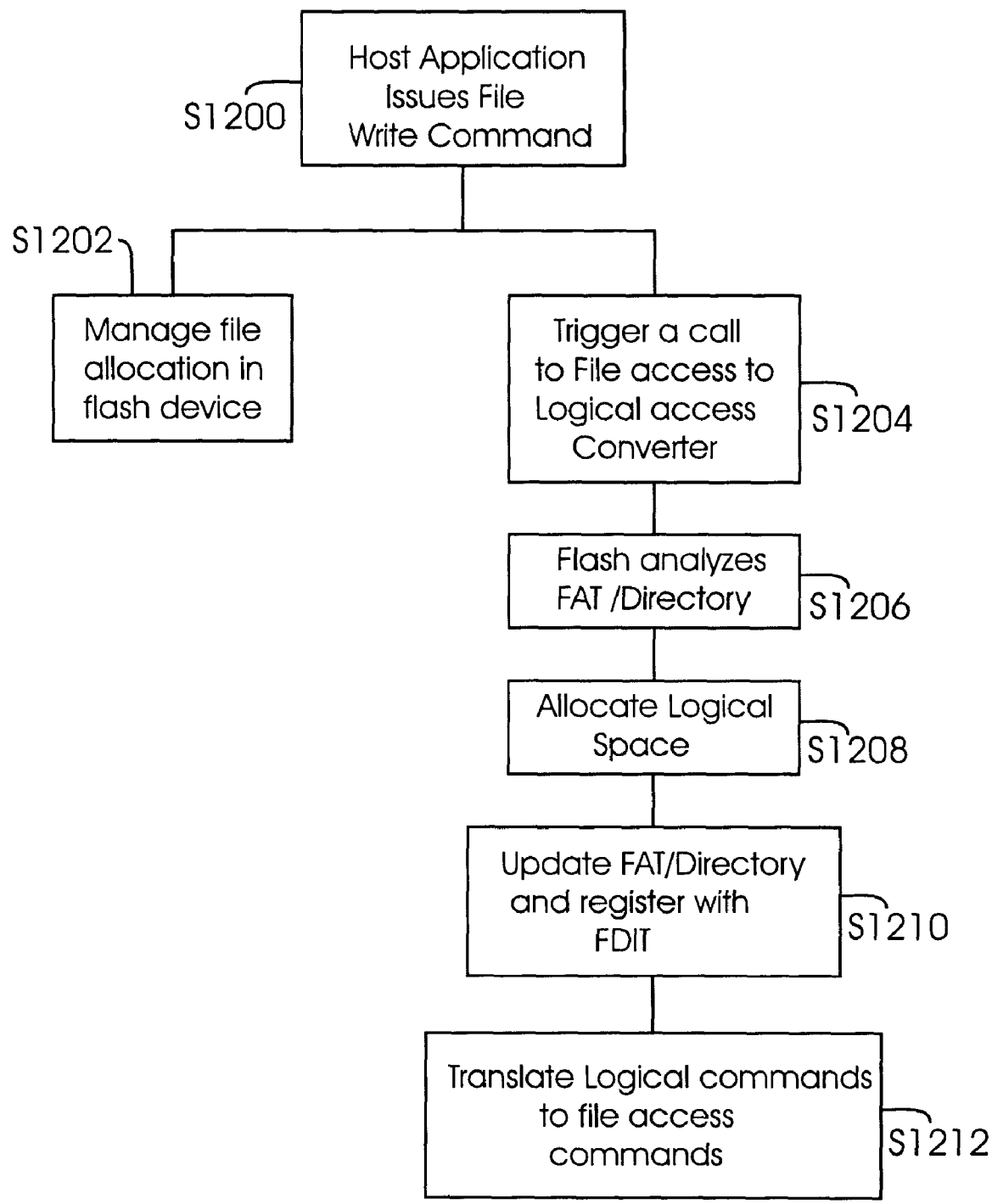

File Interface Write:

FIG. 12 shows a process flow diagram for writing via file interface 301 and using FDIT 908, converter 907 and converter 909 so that the file can be accessed via logical interface 302.

Turning in detail to FIG. 12, in step S1200, host 900 issues a write command via direct data file interface 903. The write command is a file access command (906) and not a logical command.

In step S1202, flash 105 manages the actual write operation in memory cells 107/108. Data is stored as variable length data groups (304, FIG. 3B). While data is being written or after the data is written in flash memory, in step S1204, controller 106 triggers a call to converter 907 (shown as 912A).

In step S1206, Converter 907/907A analyzes the FAT/directory area. Converter 907/907A can do this via logical commands 913A or via file access commands 913.

Based on the analysis, in step S1208, converter 907 allocates logical space for the file that is written via file interface 301.

In step S1210, FAT and directory information is updated, either through file access commands or logical commands. The file is registered with FDIT 908 so that the allocated LBAs are associated with the file name and offset. If the file access commands are used (FIG. 9A) then the process ends after step S1210.

If Converter 907A used logical access commands 913A then converter 909 converts the "logical write" commands to file access commands 915.

In another aspect of the present invention, data written via a logical interface is accessible via a file interface. Hence, the flash device can be used easily with legacy host system and advanced host systems that support the direct data file storage format.

Although the present invention has been described with reference to specific embodiments, these embodiments are illustrative only and not limiting. Many other applications and embodiments of the present invention will be apparent in light of this disclosure and the following claims.

What is claimed is:

1. A method for transferring data between a host system and a re-programmable non-volatile mass storage system having memory cells organized into blocks of memory cells, comprising:

receiving, by the re-programmable, non-volatile mass storage system, individual files of data identified by unique file identifiers, wherein the re-programmable non-volatile mass storage system receives the individual files of data via a first host-system-accessible interface of the re-programmable non-volatile mass storage system and stores the received files of data indexed by the unique identifiers;

allocating, by the re-programmable non-volatile mass storage system, a plurality of logical block addresses to the received file data; and updating, by the re-programmable non-volatile mass storage system, directory and file allocation table ("FAT") entries that are used by a host and that are stored in the plurality of memory cells, so that the received file data can be accessed via a second host-system-accessible interface of the re-programmable non-volatile mass storage system, wherein the first host-system-accessible interface is a direct data file storage (DFS) interface in which data to be written to or read from the re-programmable non-volatile mass storage system is identified to the re-programmable non-volatile mass storage system by using file identifiers defined in a first address space and the second host-system-accessible interface is a logical interface in which data to be written to or read from the re-programmable non-volatile mass storage system is identified to the mass storage system by using logical addresses defined in a second address space distinct from the first address space.

2. The method of claim 1, wherein the re-programmable non-volatile mass storage system performs the allocation by maintaining an index table in the memory cells where the file data is registered and the index table is updated when the file data is written, modified and deleted.

3. The method of claim 1, wherein logical block address allocation and the FAT update is performed in real time.

4. The method of claim 1, wherein logical block address allocation and the FAT update and is performed after a write operation.

5. The method of claim 1, wherein the logical block address allocation and FAT update is performed by an embedded file system with a file output interface that is specific to a file storage back-end system.

6. A method for transferring data between a host system and a re-programmable non-volatile mass storage system having memory cells organized into blocks of memory cells, comprising:

receiving, by the re-programmable, non-volatile mass storage system, data identified by a plurality of logical addresses via a first host-system-accessible interface of the re-programmable non-volatile mass storage system, wherein the re-programmable non-volatile mass storage system receives the data; and identifying, by the re-programmable non-volatile mass storage system, the data with file identifiers, so that the data can be accessible via a second host-system-accessible interface of the re-programmable non-volatile mass storage system, even if a file name for the data is not provided in a command received by the first host-system-accessible interface, by detecting a change made to directory and file allocation table entries that are used by a host and that are stored in the blocks of memory cells, wherein the first host-system-accessible interface is a logical interface in which data to be written to or read from the re-programmable non-volatile mass storage system is identified to the re-programmable non-volatile mass storage system by using logical addresses defined in a first address space and the second host-system-accessible interface is a direct data file storage (DFS) interface in which data to be written to or read from the re-programmable non-volatile mass storage system is identified to the re-programmable non-volatile mass storage system by using file identifiers defined in a second address space distinct from the first address space.

7. The method of claim 6, wherein the data is stored as internal files with unique file names.

8. The method of claim 7, wherein the internal files with unique file names are merged into a single file after a host file name for the data is received.

9. The method of claim 7, wherein a controller assigns the unique file names.

10. The method of claim 7, wherein the unique file name is based on a logical block address for the data.

11. The method of claim 6 wherein data is stored in non-volatile memory cells as files.

12. A method for transferring data between a host system and a re-programmable non-volatile mass storage system having memory cells organized into blocks of memory cells, comprising:

receiving, at the re-programmable non-volatile mass storage system, data identified by a plurality of logical addresses via a first host-system-accessible interface of the re-programmable non-volatile mass storage system, wherein the re-programmable non-volatile mass storage system receives the data;

identifying, by the re-programmable non-volatile mass storage system, the data with file identifiers, so that the data can be accessible via a second host-system-accessible interface of the re-programmable non-volatile mass storage system even if a file name is not provided in a command received by the first host-system-accessible interface, by detecting a change made to directory and file allocation table entries that are used by a host and that are stored in the blocks of memory cells;

storing, by the re-programmable non-volatile mass storage system, data as internal files having unique file names; and merging, by the re-programmable non-volatile mass storage system, the internal files with unique file names into a single file after a host file name for the data is received, wherein the first host-system-accessible interface is a logical interface in which data to be written to or read from the re-programmable non-volatile mass storage system is identified to the re-programmable non-volatile mass storage system by using logical addresses defined in a first address space and the second host-system-accessible interface is a direct data file storage (DFS) interface in which data to be written to or read from the re-programmable non-volatile mass storage system is identified to the re-programmable non-volatile mass storage system by using file identifiers defined in a second address space distinct from the first address space.

13. The method of claim 12, wherein the data are registered with an index table that is maintained in the memory cells.

14. The method of claim 12, wherein a controller allocates the unique file names.

15. The method of claim 12, wherein the unique file names are based on a logical block address for the data.

16. The method of claim 12, wherein the data is stored in non-volatile memory cells as files.

17. A method for transferring data between a host system and a re-programmable non-volatile mass storage system having memory cells organized into blocks of memory cells, comprising:

receiving, by the re-programmable non-volatile mass storage system, data occupying a plurality of logical block addresses via one or both of a first host-system-accessible interface of the re-programmable non-volatile mass storage system and a second host-system-accessible interface of the re-programmable non-volatile mass storage system; and making, by the re-programmable non-volatile mass storage system, data for each logical block address occupied accessible via the first host-system-accessible interface and the second host-system-accessible interface, even if a file name is not provided in a command received by the second host-system-accessible interface or before data for all of the plurality of logical block addresses has been received, by detecting a change made to directory and file allocation table entries that are used by a host and that are stored in the blocks of memory cells, wherein the first host-system-accessible interface is a direct data file storage (DFS) interface in which data to be written to or read from the re-programmable non-volatile mass storage system is identified to the re-programmable non-volatile mass storage system by using file identifiers defined in a first address space and the second host-system-accessible interface is a logical interface in which data to be written to or read from the re-programmable non-volatile mass storage system is identified to the re-programmable non-volatile mass storage system by using logical addresses defined in a second address space distinct from the first address space.

18. The method of claim 17, wherein individual files of data identified by unique file identifiers are received by the re-programmable non-volatile mass storage system via the first host-system-accessible interface and the re-programmable non-volatile mass storage system allocates the plurality of logical block addresses to the received file data; and updates directory and file allocation table ("FAT") entries in the plurality of memory cells, so that the received file data can be accessible via the second host-system-accessible interface.

19. The method of claim 17, wherein the data is stored in a plurality of non-volatile memory cells as files.

20. The method of claim 18, wherein the logical block address allocation and FAT update is performed in real time or after a write operation.

21. The method of claim 18, wherein the logical block address allocation and FAT update is performed by an embedded file system with a file output interface that is specific to a file storage back-end system.

22. The method of claim 17, wherein data received via the second host-system-accessible interface is identified by the plurality of logical addresses; and the re-programmable non-volatile mass storage system identifies the data received via the second host-system-accessible interface with file identifiers, so that the data can be accessible via the first host-system-accessible interface.

23. The method of claim 22, wherein the data identified by the plurality of logical addresses are registered with an index table that is maintained in the memory cells and stored as internal files having unique file names.

24. The method of claim 23, wherein the internal files with unique file names are merged into a single file after a host file name for the data is received.

25. The method of claim 23, wherein the index table is updated such that data identified by the plurality of logical addresses are associated with unique file identifiers.

26. The method of claim 23, wherein the unique file names are based on a logical block address for the data.

* * * * *